United States Patent
Joo et al.

(10) Patent No.: US 8,812,933 B2
(45) Date of Patent: Aug. 19, 2014

(54) MEMORY SYSTEM AND OPERATING METHOD THEREOF

(75) Inventors: Sang-Hyun Joo, Hwaseong-si (KR); Kitae Park, Seongnam-si (KR); Sangyong Yoon, Seoul (KR); Jinman Han, Seongnam-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 140 days.

(21) Appl. No.: 13/449,501

(22) Filed: Apr. 18, 2012

(65) Prior Publication Data
US 2013/0117620 A1    May 9, 2013

(30) Foreign Application Priority Data
Nov. 4, 2011    (KR) .......................... 10-2011-0114282

(51) Int. Cl.
| | |
|---|---|
| *G06F 11/00* | (2006.01) |
| *G11C 29/00* | (2006.01) |
| *H03M 13/00* | (2006.01) |
| *G11C 11/34* | (2006.01) |
| *G11C 8/00* | (2006.01) |
| *G06F 11/10* | (2006.01) |
| *G06F 11/08* | (2006.01) |
| *H03M 13/15* | (2006.01) |

(52) U.S. Cl.
CPC ........ *G06F 11/1016* (2013.01); *G06F 11/1008* (2013.01); *G06F 11/08* (2013.01); *G06F 11/10* (2013.01); *G06F 11/1048* (2013.01); *G06F 11/1068* (2013.01); *G06F 11/1076* (2013.01); *G06F 11/108* (2013.01); *H03M 13/151* (2013.01); *H03M 13/1525* (2013.01); *H03M 13/1545* (2013.01)

USPC .......... 714/763; 714/773; 714/746; 714/766; 714/768; 714/799; 714/805; 714/752; 714/742; 714/2; 714/6.13; 714/6.21; 714/6.24; 714/25; 714/42; 714/48; 714/54; 365/185.09; 365/185.33; 365/200; 365/201; 365/230.03

(58) Field of Classification Search
CPC ..... G06F 11/1008; G06F 11/08; G06F 11/10; G06F 11/1016; G06F 11/1048; G06F 11/1068; G06F 11/1076; G06F 11/108; H03M 13/151; H03M 13/1525; H03M 13/154
USPC ......... 714/773, 746, 763, 766, 768, 799, 805, 714/2, 6.13, 6.21, 6.24, 25, 42, 48, 54, 752, 714/742; 365/185.09, 185.33, 200, 201, 365/230.03
See application file for complete search history.

(56) References Cited

U.S. PATENT DOCUMENTS 5,754,753 A * 5/1998 Smelser ...................... 714/6.13
6,651,212 B1 * 11/2003 Katayama et al. ............ 714/763
(Continued)

FOREIGN PATENT DOCUMENTS

| | | |
|---|---|---|
| JP | 2001092723 | 4/2001 |
| JP | 2005242797 | 9/2005 |

(Continued)

*Primary Examiner* — John J Tabone, Jr.
(74) *Attorney, Agent, or Firm* — Stanzione & Kim, LLP

(57) ABSTRACT

A memory system includes a nonvolatile memory device and a memory controller configured to control the nonvolatile memory device and configured to provide the nonvolatile memory device with error flag information including error location information of an error of data read from the nonvolatile memory device.

37 Claims, 34 Drawing Sheets

(56) References Cited

U.S. PATENT DOCUMENTS

| | | | |
|---|---|---|---|
| 6,858,906 B2 | 2/2005 | Lee et al. | |
| 7,224,607 B2 * | 5/2007 | Gonzalez et al. | 365/185.11 |
| 7,272,758 B2 * | 9/2007 | Roohparvar | 714/723 |
| 7,275,190 B2 * | 9/2007 | Roohparvar | 714/723 |
| 7,280,415 B2 * | 10/2007 | Hwang et al. | 365/189.09 |
| 7,299,400 B2 | 11/2007 | Yusa | |
| 7,437,625 B2 * | 10/2008 | Roohparvar | 714/710 |
| 7,529,124 B2 | 5/2009 | Cho et al. | |
| 7,602,642 B2 * | 10/2009 | Choi | 365/185.09 |
| 7,610,525 B2 * | 10/2009 | Roohparvar | 714/723 |
| 7,640,465 B2 * | 12/2009 | Roohparvar | 714/710 |
| 7,650,541 B2 * | 1/2010 | Roohparvar | 714/723 |
| 7,681,106 B2 | 3/2010 | Jarrar et al. | |
| 7,757,153 B2 * | 7/2010 | Hwang et al. | 714/763 |
| 7,813,187 B2 * | 10/2010 | Lee | 365/189.05 |
| 8,301,986 B2 * | 10/2012 | Jo et al. | 714/785 |
| 8,316,278 B2 * | 11/2012 | Ahn et al. | 714/763 |
| 8,392,794 B2 * | 3/2013 | Ou | 714/758 |
| 8,499,227 B2 * | 7/2013 | Liikanen et al. | 714/786 |
| 8,555,116 B1 * | 10/2013 | Shaeffer et al. | 714/53 |
| 8,560,925 B2 * | 10/2013 | Hughes et al. | 714/773 |
| 2004/0169238 A1 | 9/2004 | Lee et al. | |
| 2005/0229033 A1 * | 10/2005 | Tanaka et al. | 714/6 |
| 2006/0180851 A1 | 8/2006 | Lee et al. | |
| 2006/0218437 A1 * | 9/2006 | Kawa et al. | 714/6 |
| 2009/0055680 A1 * | 2/2009 | Honda et al. | 714/5 |
| 2009/0164871 A1 * | 6/2009 | Jo | 714/764 |
| 2009/0249138 A1 | 10/2009 | Liu et al. | |
| 2009/0307525 A1 * | 12/2009 | Hiratsuka et al. | 714/8 |
| 2010/0269000 A1 * | 10/2010 | Lee | 714/718 |
| 2010/0318879 A1 * | 12/2010 | Yu | 714/758 |
| 2011/0035539 A1 * | 2/2011 | Honda | 711/103 |
| 2011/0072332 A1 * | 3/2011 | Tomlin | 714/763 |
| 2011/0107012 A1 * | 5/2011 | Kan | 711/103 |
| 2011/0191649 A1 * | 8/2011 | Lim et al. | 714/752 |
| 2012/0023365 A1 * | 1/2012 | Byom et al. | 714/6.13 |
| 2012/0117444 A1 * | 5/2012 | Arya | 714/763 |
| 2012/0216094 A1 * | 8/2012 | Yoo et al. | 714/758 |
| 2013/0145234 A1 * | 6/2013 | Yoon et al. | 714/773 |
| 2013/0170296 A1 * | 7/2013 | Yun | 365/185.09 |
| 2013/0179751 A1 * | 7/2013 | Linstadt | 714/763 |

FOREIGN PATENT DOCUMENTS

| | | |
|---|---|---|
| JP | 2010277687 | 12/2010 |
| KR | 100673020 | 1/2007 |
| KR | 1020090102115 | 9/2009 |

* cited by examiner

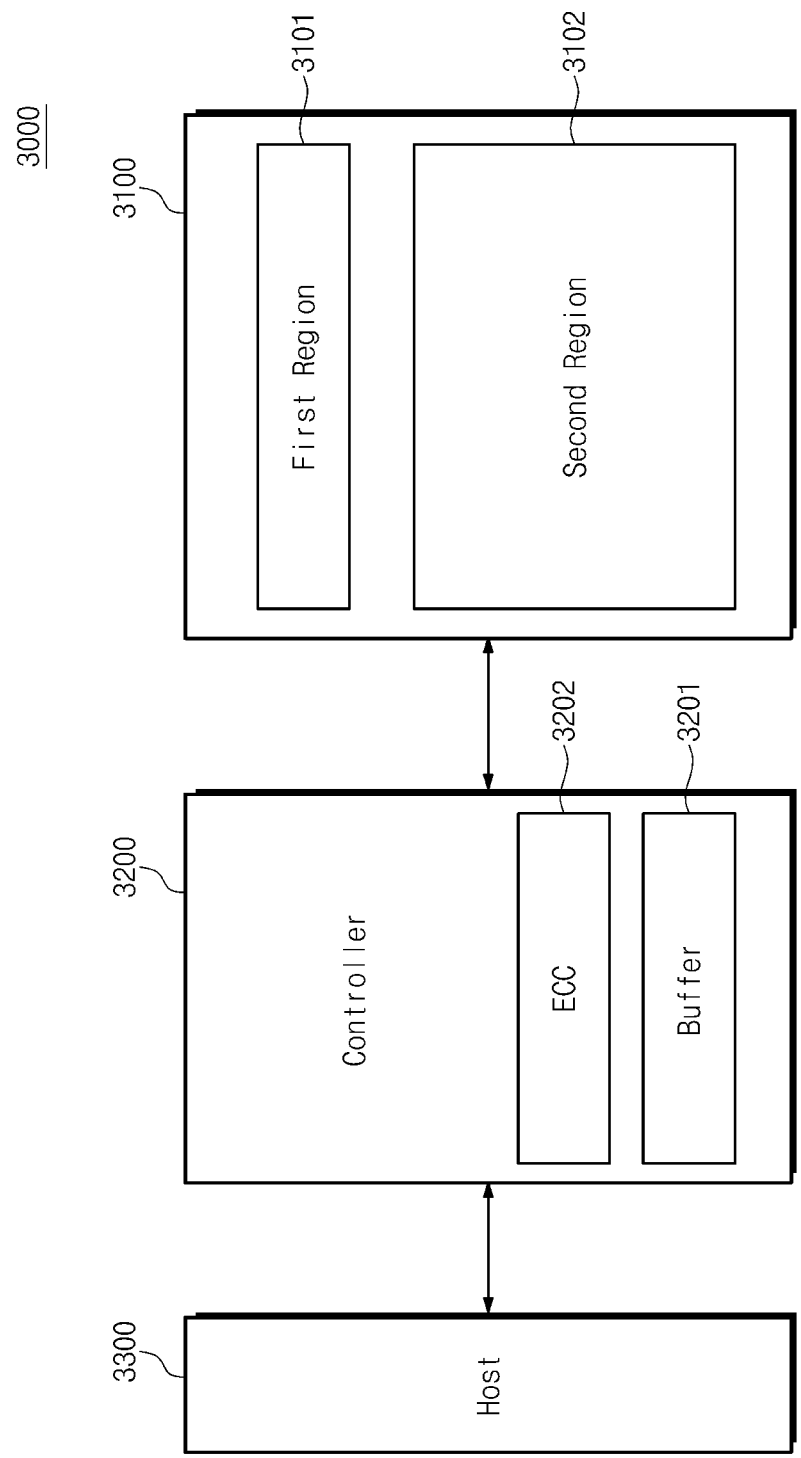

MEMORY SYSTEM AND OPERATING METHOD THEREOF

CROSS-REFERENCE TO RELATED APPLICATIONS

This application claims the benefits of priority, under 35 U.S.C §119, from Korean Patent Application No. 10-2011-0114282 filed on Nov. 4, 2011, the entirety of which is incorporated by reference herein.

BACKGROUND OF THE INVENTION

1. Field of the Invention

Exemplary embodiments relate to a memory system including a nonvolatile memory device and a controller to control the nonvolatile memory.

2. Description of the Related Art

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices, such as random access memory (RAM) devices, and nonvolatile memory devices. In the RAM devices, data is stored by either establishing a logic state of a bistable flip-flop, such as in a static random access memory (SRAM), or charging a capacitor in a dynamic random access memory (DRAM). In both SRAM and DRAM devices, data remains stored and may be read as long as the power is applied, but data is lost when the power is turned off.

Mask Read-Only Memory (MROM), Programmable Read-Only Memory (PROM), Erasable Programmable Read-Only Memory (EPROM), and Electrically Erasable Programmable Read-Only Memory (EEPROM) devices are capable of storing the data, even with the power turned off. The non-volatile memory data storage state may be permanent or reprogrammable, depending upon the fabrication technology used therein. Nonvolatile semiconductor memories are used to store program and microcode storage in a wide variety of applications in the computer, avionics, telecommunications, and consumer electronics industries. A combination of single-chip volatile as well as nonvolatile memory storage modes is also available in devices such as nonvolatile SRAM (nvRAM) for use in systems that require fast, reprogrammable nonvolatile memory. In addition, dozens of special memory architectures have evolved which contain some additional logic circuitry to optimize their performance for application-specific tasks.

Mask Read-Only Memory (MROM), Programmable Read-Only Memory (PROM) and Erasable Programmable Read-Only Memory (EPROM) nonvolatile memory devices are not free to erase and write by system itself, so it is not easy to update the contents of the memory. On the other hand, Electrically Erasable Programmable Read-Only Memory (EEPROM) nonvolatile memory devices are electrically erasable and writable, and may, thus, be readily applied to auxiliary memories or system programming memories that require continuous update.

SUMMARY OF THE INVENTION

The present general inventive concept provides a memory system including a nonvolatile memory device and a controller to control the nonvolatile memory, and an electronic apparatus useable with the memory system.

Additional aspects and advantages of the present general inventive concept will be set forth in part in the description which follows and, in part, will be obvious from the description, or may be learned by practice of the general inventive concept.

The foregoing features and utilities of the present general inventive concept may be achieved by providing a memory system including a nonvolatile memory device configured to read data, to receive error information, and to correct the read data according to the received error information, and a controller having an interface unit configured to receive the read data, and having a unit configured to determine a location of an error bit of the received data such that the interface outputs the error information on the determined error bit location of the received data. The error information may include bits corresponding to bits of the read data, the bits of the error information include a bit representing an error of a bit of the read data, and a value of the bit of the read data is changed according to a value of the bit of the error information.

The nonvolatile memory device may output the read data to the controller and receive the error information from the controller.

The controller may output the error information to the nonvolatile memory device, and the error information may not include the read data and corrected data of the read data.

The nonvolatile memory device may output the read data as randomized data to the controller, and receive the error information as non-randomized data from the controller.

The nonvolatile memory device may include a page buffer unit to store the read data after outputting the read data to the controller and when receiving the error information from the controller such that the stored read data is corrected according to the received error information.

The error information may not correspond to all of the bits of the read data.

The nonvolatile memory device may change the value of the bit corresponding to the value of the bit of the received error information as a changed bit and stores the changed bit and maintained bit as the corrected data.

The nonvolatile memory device may maintain values of bits which do not correspond to the error information and stores the corrected data having the bit with the changed value and the bits with the maintained values.

The nonvolatile memory device may include a single bit memory array and a multi bit memory array, reads the data from the single bit memory array, and stores the corrected data in the multi bit memory array.

The nonvolatile memory device may read the data programmed using an SLC program method and store the corrected data according to an MLC program method.

The nonvolatile memory device may receive the error information in a page unit from the controller.

The read data and the error information may have a same data size.

The nonvolatile memory device may receive the error information corresponding to the read data in a copying operation to copy the data from a first region to a second region thereof.

The nonvolatile memory device may activate the reading the data and the storing the corrected data according to the received error information in response to a command indicating a copy operation.

The nonvolatile memory device may include a page buffer latch configured to perform the correction of the bit with the error according to the error information in a page unit of the read data, and the page buffer latch may be configured to store the read data, the error information, and the corrected data.

The nonvolatile memory device may perform a bit-by-bit comparison between the bits of the read data and the error information to correct the error bit of the read data according to one of an exclusive OR method and an exclusive NOR method.

The bits of the error information may include a second bit representing a non-error of another bit of the read data, and a value of the another bit of the read data is not changed according to a value of the second-bit of the error information.

The foregoing features and utilities of the present general inventive concept may also be achieved by providing a memory system including a nonvolatile memory device to output data and a controller having an interface unit configured to receive the data from the nonvolatile memory device, and having a unit configured to determine a location of an error bit of the received data such that the interface outputs information on the determined error bit location of the received data to the nonvolatile memory device.

The controller may de-randomize the received data to determine the location of the error bit from the received data and output the information without randomization.

The controller may comprise a randomizer/de-randomizer to de-randomize the received data, and the controller may prevent the randomizer/de-randomizer to randomize the information.

The nonvolatile memory device may correct the data according to the received error location information.

The nonvolatile memory device may include a region from which the data has been read, and perform a refresh program on the region according to the corrected data.

The nonvolatile memory device may include a second region to store the corrected data, and the second region may be a multi-bit memory array.

The information on the determined error bit location of the received data may include an address of the determined error bit location of the received data such that the nonvolatile memory device corrects the data according to the address.

The foregoing features and utilities of the present general inventive concept may also be achieved by providing a memory system including a controller and a nonvolatile memory device having a first region having a single bit memory array to store data according to a first program method and a second region having a multi-bit memory array, and configured to read the data of each of a plurality of pages from the first region, and configured to output the data of each of the plurality of pages to the controller. The controller may generate error location information of the data of each of the plurality of pages and output the error location information of the data of each of the plurality of pages to the nonvolatile memory device. The nonvolatile memory device may correct the data of each of the pages according to the error location information corresponding to the data of each of the plurality of pages, and store the corrected data of the plurality of the pages at once in the second region according to a second program method.

The data may include a plurality of pages having at least a first page and a second page, and the controller may repeat receiving the data such that first error information is determined and output in response to the first page and such that second error information is determined and output in response to the second page.

The nonvolatile memory device may simultaneously read the data and receive the error location information.

The nonvolatile memory device may include a buffer circuit to simultaneously store the read data and the received error location information.

The nonvolatile memory device may include a main buffer to store the read data and a cache buffer to receive the error location information to correct the stored data in the main buffer according to the error location information.

The nonvolatile memory device may include a main buffer to communicate with the first region and the second region to store the read data and the corrected data, and a cache buffer to communicate with the controller to receive the error location information.

The nonvolatile memory device may perform a flipping operation of flipping a bit of the read data according to the error location information to generate the corrected data.

The multi-bit memory array of the second region may be a 3-bit memory array.

The second program method may include a plurality of operations each to generate different voltages according to the corrected data to be stored in the multi-bit memory array of the second region.

The second program method may include a reprogram method to generate different voltages according to the corrected data to be stored in the multi-bit memory array of the second region.

The information may correspond to one of portions of the read data, and the read data may be repeatedly transmitted from the controller to the nonvolatile memory device. A number of information may be transmitted from the controller to the nonvolatile memory device until corresponding to all portions of the read data, and the nonvolatile memory device may correct each portion of the data according to the corresponding information upon receiving the corresponding information.

The memory system may further include a host apparatus having a functional unit and a terminal to be connectable to the controller to store data in the nonvolatile memory device.

The host apparatus may output the data generated from the functional unit to be stored in the nonvolatile memory device through the controller or may receive the data from the nonvolatile memory device to be used in the functional unit.

The host apparatus may be at least one of a video camera, a television apparatus, an audio device, a game machine, an electronic music device, a cellular phone, a computer a Personal Digital Assistant, a voice recorder, and a card.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 14 is a block diagram schematically illustrating a data storage system according to an exemplary embodiment of the inventive concept.

DETAILED DESCRIPTION OF THE PREFERRED EMBODIMENTS

Figure 1:
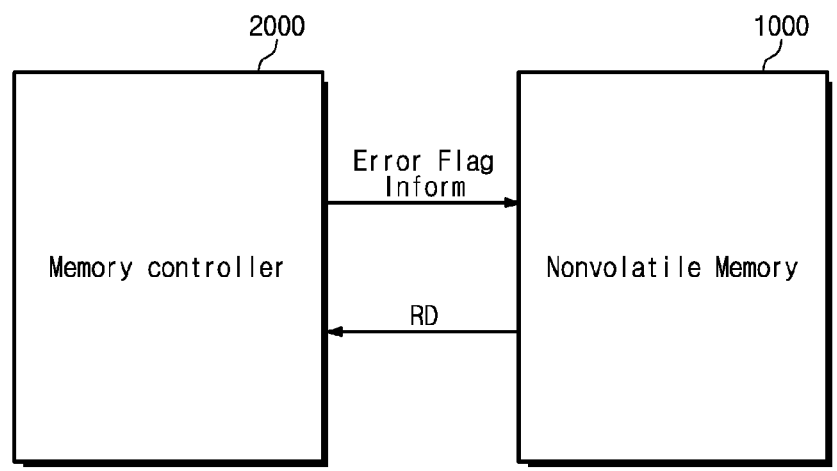
FIG. 1 is a block diagram schematically illustrating a memory system according to an exemplary embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an exemplary embodiment of the inventive concept.

Referring to FIG. 1, the memory system according to an exemplary embodiment of the inventive concept may include a nonvolatile memory device 1000 and a memory controller 2000. The nonvolatile memory device 1000 may be used as a storage medium to store data information. The storage medium may be formed of one or more memory chips. The one or more memory chips may be formed as a semiconductor package or a memory package. The nonvolatile memory device 1000 and the memory controller 2000 may communicate with each other via one or more channels. The nonvolatile memory device 1000, for example, may include a NAND flash memory device. The memory controller 2000 may be configured to control the nonvolatile memory device 1000 according to a request of an external device (e.g., a host) or an internal request (e.g., a request associated with background operations such as merging, garbage collection, etc.).

In an exemplary embodiment, it is well understood that the nonvolatile memory device 1000 is not limited to the NAND flash memory device. For example, the nonvolatile memory device 1000 may be formed of a Resistive Random Access Memory (RRAM), a Phase-Change Memory (PRAM), a Magnetoresistive Random Access Memory (MRAM), a Ferroelectric Random Access Memory (FRAM), a Spin Transfer Torque Random Access Memory (STT-RAM), and the like. The nonvolatile memory device 1000 according to the inventive concept may be implemented to have a three-dimensional array structure. The nonvolatile memory device with the three-dimensional array structure may be referred to as a vertical NAND flash memory device. The inventive concept may be applied to both a flash memory device, in which a charge storing layer is formed of a conductive floating gate, and a Charge Trap Flash (CTF) memory device in which a charge storing layer is formed of an insulation film.

The memory system according to an exemplary embodiment of the inventive concept may support an operation of copying data to a first storage region of the nonvolatile memory device 1000 from a second storage region thereof. This operation may be referred to as a copyback operation, for example. The operation of copying data to the second storage region from the first storage region may include error detecting and correcting operations associated with the data read out from the first storage region. This may be made to improve the data reliability. Herein, the first storage region may be different from or identical to the second storage region. With the memory system of the inventive concept, error detection of read data RD read out from the nonvolatile memory device 1000 may be made by the memory controller 2000, and error correction thereof may be made within the nonvolatile memory device 1000. The memory controller 2000 may provide the nonvolatile memory device 1000 with location information of a detected error (hereinafter, referred to as error location information) and pattern information (hereinafter, referred to as error flag information) in the error detection, and the nonvolatile memory device 1000 may correct an error of data based on the error location information and the error flag information provided from the memory controller 2000 in the error correction. That is, since the error correction is not made by the memory controller 2000 after the error detection (or, since error correction is made by the nonvolatile memory device 1000 after the error detection of the memory controller 2000), it may not be necessary for the memory controller 2000 to transfer all data (or, corrected data) received from the nonvolatile memory device 1000 to the nonvolatile memory device 1000. That is, a time taken to transfer data to the nonvolatile memory device 1000 from the memory controller 2000 or a power consumed to transfer data to the nonvolatile memory device 1000 from the memory controller 2000 is reduced, prevented, or avoided.

Figure 2:
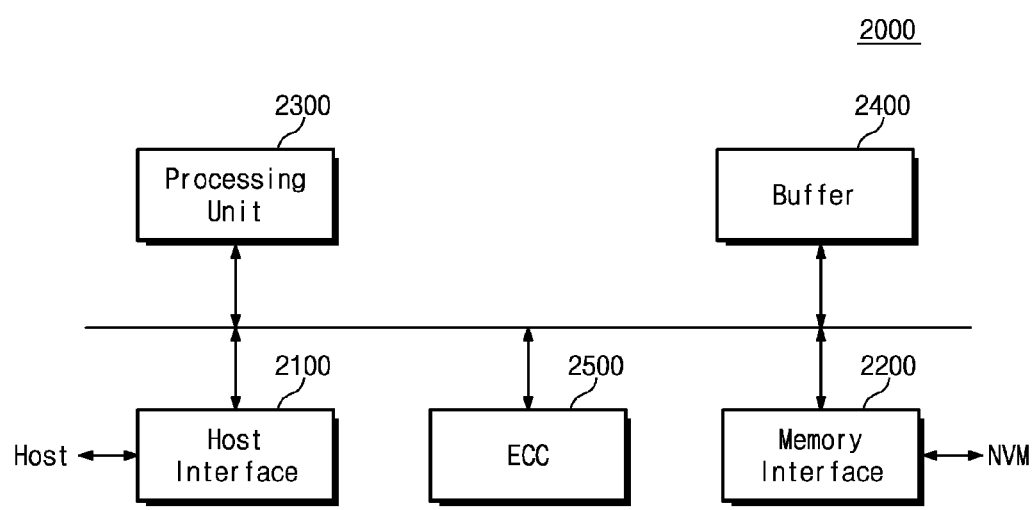
FIG. 2 is a block diagram schematically illustrating a memory controller of the memory system of FIG. 1.

FIG. 2 is a block diagram schematically illustrating the memory controller 2000 of the memory system of FIG. 1. Referring to FIG. 2, the controller 2000 may include a host interface 2100 as a first interface, a memory interface 2200 as a second interface, a processing unit 2300 such as a CPU, a buffer memory 2400, and an error detecting and correcting circuit 2500.

The host interface 2100 may be configured to interface with an external device (for example, a host), and the memory interface 2200 may be configured to interface with a nonvolatile memory device 1000 illustrated in FIG. 1. The processing unit 2300, for example, the CPU, may be configured to control an overall operation of the controller 2000. The processing unit 2300 may be configured to operate firmware such as Flash Translation Layer (FTL). The buffer memory 2400 may be used to temporarily store data transferred from an external device via the host interface 2100 or data transferred from the nonvolatile memory device 1000 via the memory interface 2200.

The error detecting and correcting circuit 2500 may be configured to encode data to be stored in the nonvolatile memory device 1000 and to decode data read out therefrom. Encoding may include generating parity information, which is generated a field unit. One page of data may be formed of one or more fields. Decoding may include an error detecting operation and an error correcting operation. When data output from the nonvolatile memory device 1000 is sent to an external device, the decoding including the error detecting operation and the error correcting operation may be made by the error detecting and correcting circuit 2500. At the above-described copy operation, the error detecting and correcting circuit 2500 may perform an error detecting operation on data read out from the nonvolatile memory device 1000 with an error correcting operation. The error detecting and correcting circuit 2500 may generate error location information and error flag information as a result of the error detecting operation, and the error location information and the error flag information may be sent to the nonvolatile memory device 1000 via the memory interface 2200 under the control of the processing unit 2300. For example, the error location information may include a column address to indicate or designate an erroneous data bit, and the error flag information may be bit information to indicate whether a data bit of a location designated by the error location information is erroneous. In an embodiment, the error detecting and correcting circuit 2500 may provide the nonvolatile memory device 1000 with field data (note that the field data is not error-corrected data) including bit information (i.e., error flag information) indicating that a data bit of a location designated by error location information is erroneous, as a result of the error detecting operation. This will be more fully described later.

Although not illustrated in FIG. 2, the memory controller 2000 may further comprise a ROM. The ROM may be used to store the firmware such as the FTL. In another embodiment, it is possible to configure the memory controller 2000 not to include the ROM. In this case, the firmware in the ROM may be stored in the nonvolatile memory device 1000 controlled by the memory controller 2000, and may be loaded onto the memory controller 2000 from the nonvolatile memory device 1000 at an power-up or turn-on state. It is also possible that the processing unit 2300, the buffer memory 2400, and the error detecting and correcting circuit 2500 of the memory controller 2000 may be formed as a unit configured to perform a method of determining a location of an error bit of the received data and generating information on the determined error bit location of the received data such that the information is sent to the nonvolatile memory device 1000.

In an exemplary embodiment, the host interface 2100 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Figure 3:
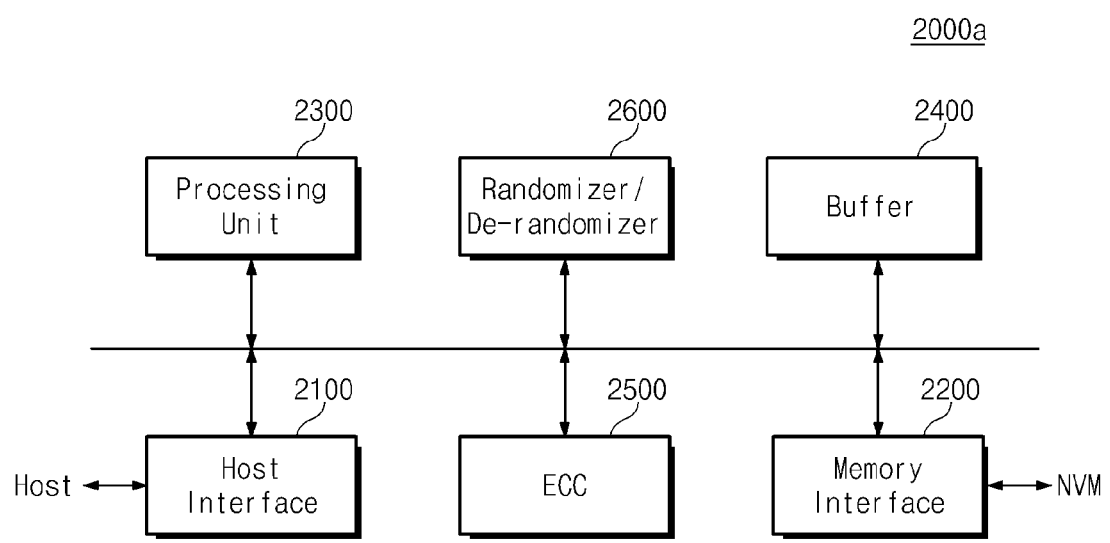
FIG. 3 is a block diagram schematically illustrating a memory controller of the memory system of FIG. 1 according to an exemplary embodiment of the inventive concept.

FIG. 3 is a block diagram schematically illustrating a memory controller 2000*a* as the memory controller 2000 of the memory system of FIG. 1 according to an exemplary embodiment of the inventive concept. FIG. 3 illustrates constituent elements which are substantially identical to those of FIG. 2, and these may be represented by the same reference numerals. Thus, descriptions thereof will be thus omitted. The memory system 2000*a* illustrated in FIG. 3 may further include a randomizer/de-randomizer 2600.

The randomizer/de-randomizer 2600 may be configured to randomize data being transferred to a nonvolatile memory device 1000 and to de-randomize data (e.g., randomized data) output from the nonvolatile memory device 1000. At the above-described copy operation, the randomizer/de-randomizer 2600 may de-randomize data (e.g., randomized data) output from the nonvolatile memory device 1000 and an error detecting and correcting circuit 2500 may detect an error of the de-randomized data. As described above, error flag information transferred to the nonvolatile memory device 1000 from the memory controller 2000*a* may not be randomized. Likewise, in a case where field data including error flag information is sent, the randomizer/de-randomizer 2600 does not operate. If error-corrected data is sent to the nonvolatile memory device 1000, error-corrected data may be randomized by the randomizer/de-randomizer 2600. For the inventive concept, since error correction is made by the nonvolatile memory device 1000 according to error flag information provided from the memory controller 2000*a*, randomization of the randomizer/de-randomizer 2600 may not be made upon transferring of error flag information/field data (including error flag information).

Figure 4:
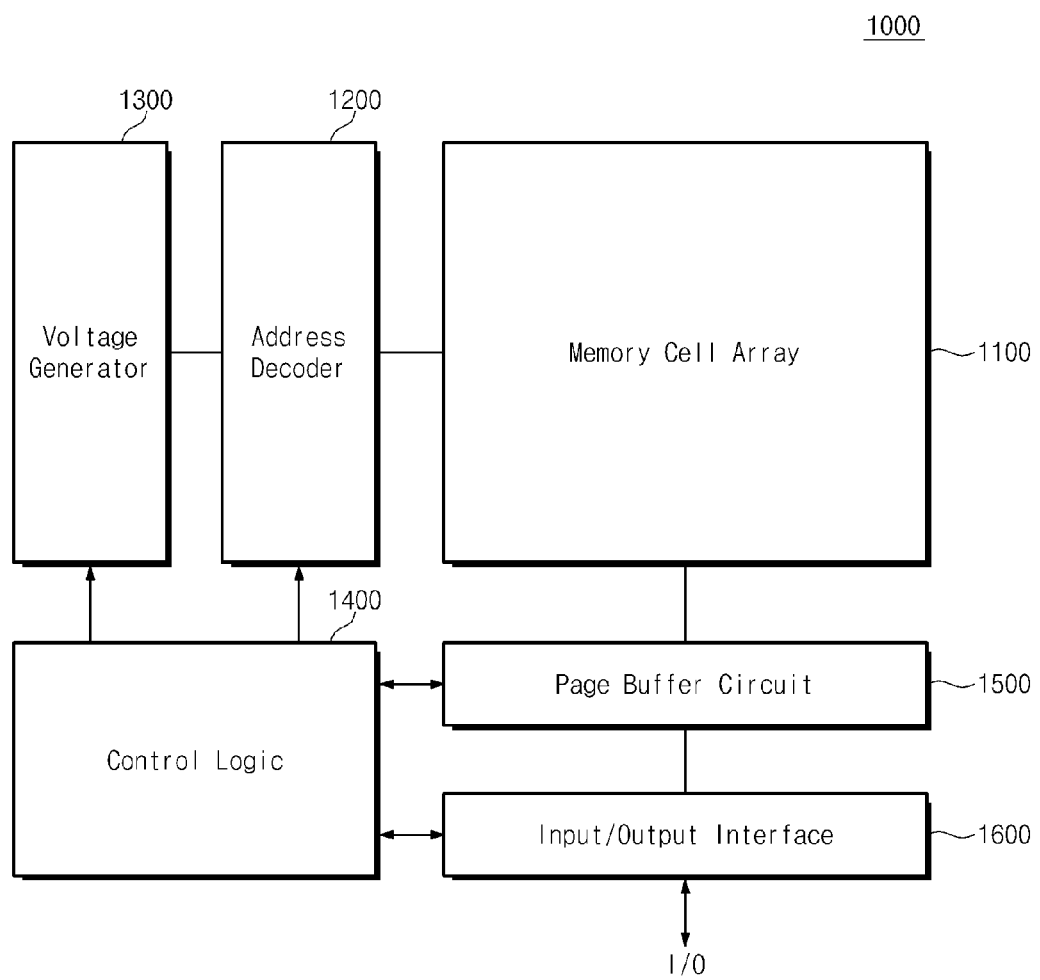
FIG. 4 is a block diagram schematically illustrating a nonvolatile memory device of the memory system of FIG. 1 according to an exemplary embodiment of the inventive concept.

FIG. 4 is a block diagram schematically illustrating the nonvolatile memory device 1000 of the memory system of FIG. 1 according to an exemplary embodiment of the inventive concept. Referring to FIG. 4, the nonvolatile memory device 1000 may include a memory cell array 1100, an address decoder 1200, a voltage generator 1300, control logic 1400, a page buffer circuit 1500, and an input/output interface 1600.

The memory cell array 1100 may include memory cells arranged at intersections of rows (e.g., word lines) and columns (e.g., bit lines). Each memory cell may store 1-bit data or multi-bit data. The address decoder 1200 may be controlled by the control logic 1400, and may make selection and driving of rows (e.g., word lines, a string selection line(s), a ground selection line(s), a common source line, etc.) of the memory cell array 1100. The voltage generator 1300 may be controlled by the control logic 1400 to generate voltages for each operation such as a high voltage, a program voltage, a read voltage, a verification voltage, an erase voltage, a pass voltage, a bulk voltage, etc. Voltages generated by the voltage generator 1300 may be provided to the memory cell array 1100 via the address decoder 1200. The control logic 1400 may be configured to control an overall operation of the nonvolatile memory device 1000. The page buffer circuit 1500 may be controlled by the control logic 1400, and may be configured to read data from the memory cell array or to drive columns (e.g., bit lines) of the memory cell array 1100 according to program data. The input/output interface 1600 may be controlled by the control logic 1400, and may be configured to interface with an external device (e.g., a memory controller in FIG. 1).

The page buffer circuit 1500 may include a plurality of page buffers corresponding to bit lines or bit line pairs, respectively. Each page buffer may include a plurality of latches. The page buffer circuit 1500 may execute an error correcting operation using latches of each page buffer under the control of the control logic 1400. That is, the page buffer circuit 1500 may perform an error correcting operation according to error flag information provided from a memory controller under the control of the control logic 1400. In an embodiment of the inventive concept, the error correcting operation may be accomplished by inverting a value of a data bit corresponding to error location information. That is, a value of a data bit corresponding to error location information may be inverted according to error flag information. This error correcting operation may be referred to a bit flip operation. This will be more fully described later.

Figure 5:
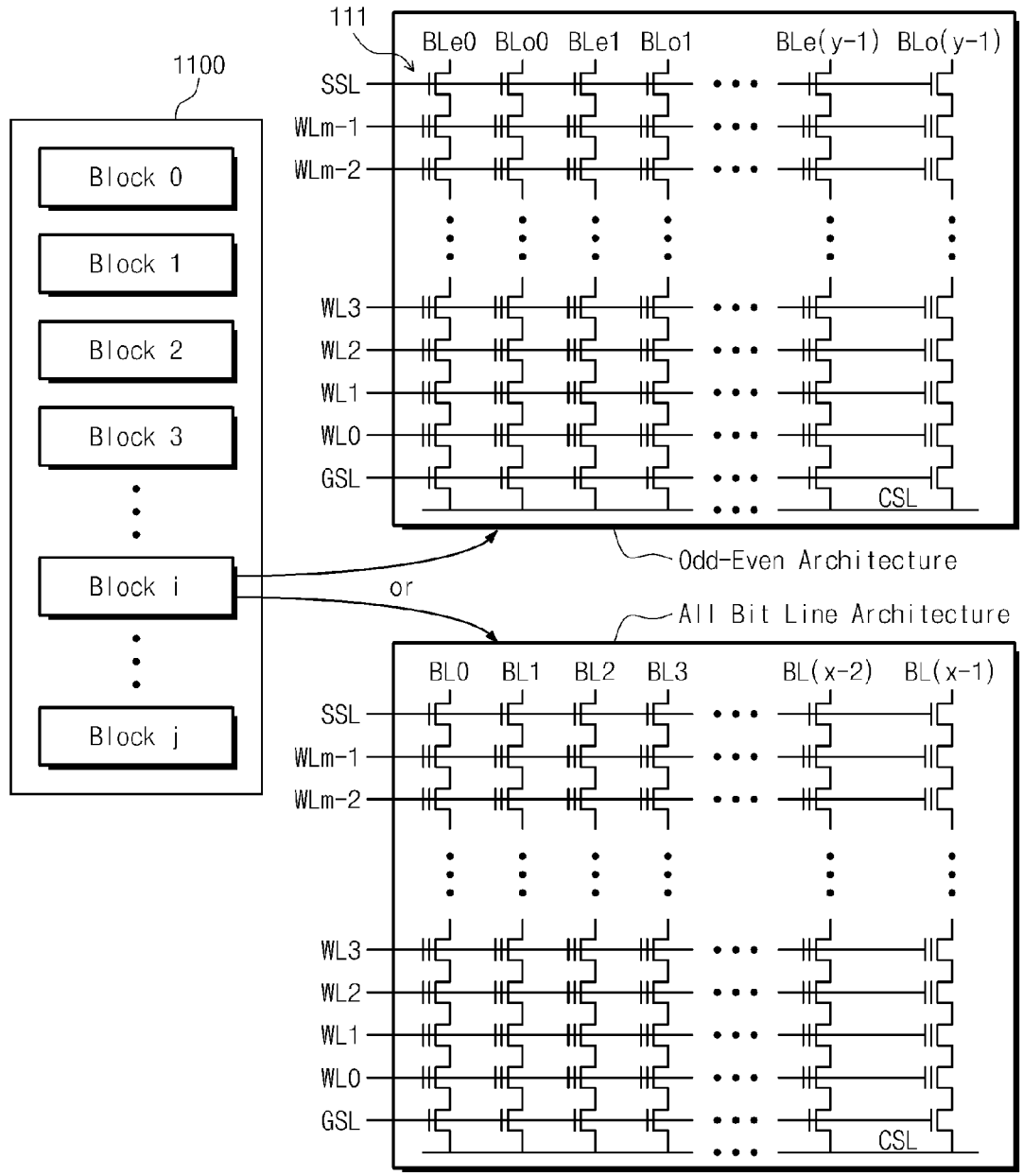
FIG. 5 is a diagram schematically illustrating a memory cell array having an all bit line memory architecture or an odd-even memory architecture in the nonvolatile memory device of FIG. 4.

FIG. 5 is a diagram schematically illustrating a memory cell array having an all bit line memory architecture or an odd-even memory architecture as the memory cell array 1100 of the nonvolatile memory device of FIG. 4. Exemplary structures of the memory cell array 1100 will be described hereinafter. As one example, a NAND flash memory device including the memory cell array 1100 partitioned into 1,024 blocks will now be described. The data stored in each block may be simultaneously erased. In one embodiment, the memory block may be the minimum unit of storage elements that are simultaneously erased. Each memory block, for example, may have columns each corresponding to bit lines (e.g., bit lines of 1 KB). In one embodiment referred to as the all bit line (ABL) architecture, all the bit lines of a memory block may be capable of being simultaneously selected during read and program operations. Storage elements in a common word line and connected to all bit lines may be capable of being programmed at the same time.

In an exemplary embodiment, a plurality of storage elements in the same column may be connected in series to form a NAND string 111. One end of the NAND string 111 may be connected to a corresponding bit line via a selection transistor which is controlled by a string selection line SSL, and the other end may be connected to a common source line CSL via a selection transistor which is controlled by a ground selection line GSL.

In an embodiment referred to as the odd-even architecture, bit lines may be divided into even bit lines (BLe) and odd bit lines (BLo). In the odd/even bit line architecture, storage elements in a common word line and connected to the odd bit lines may be programmed at a first time, while storage elements in the common word line and connected to even bit lines may be programmed at a second time. Data can be programmed and read into and from different blocks. Such operations are capable of being performed at the same time.

Figure 6:
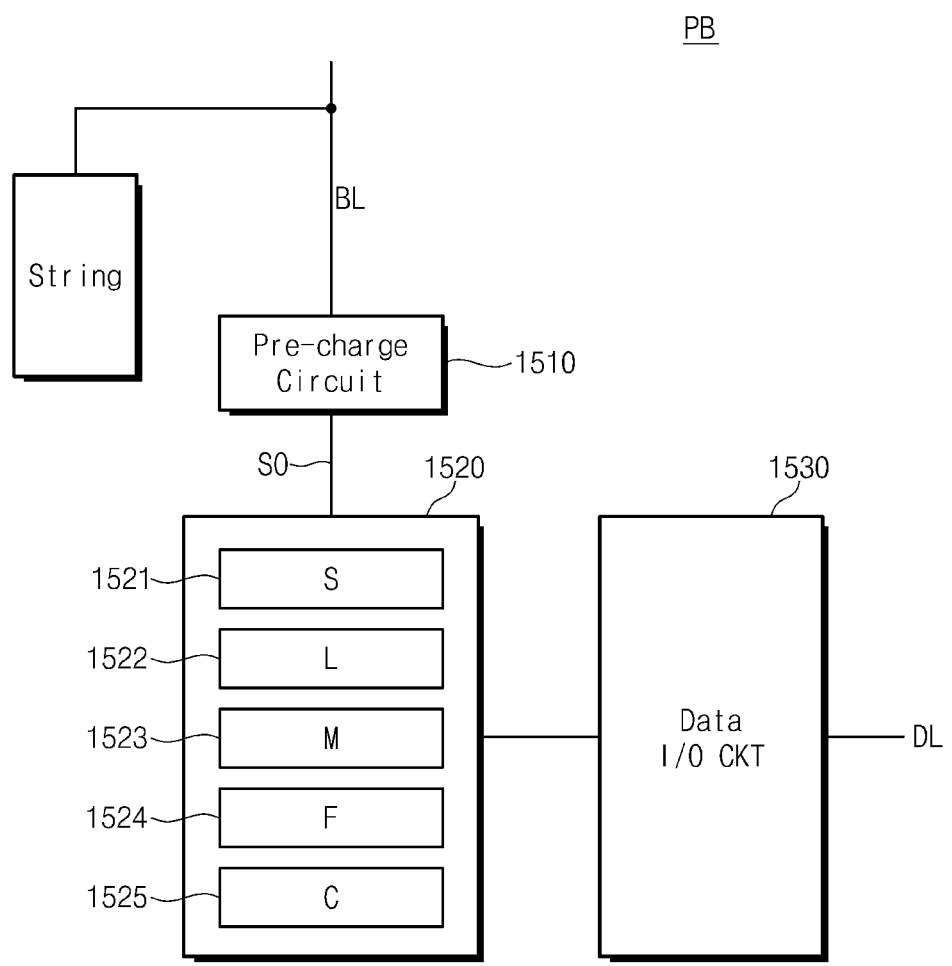
FIG. 6 is a block diagram illustrating a part of a page buffer circuit of the nonvolatile memory device of FIG. 5 according to an exemplary embodiment of the inventive concept.

FIG. 6 is a block diagram illustrating a portion of the page buffer circuit 1500 of the nonvolatile memory device 1000 of FIG. 5 according to an exemplary embodiment of the inventive concept. The page buffer circuit 1500 according to an exemplary embodiment of the inventive concept may include a plurality of page buffers PB connected with bit lines, respectively. In FIG. 6, only one page buffer PB is illustrated exemplarily. The remaining page buffers may be configured the same as that illustrated in FIG. 6.

Referring to FIGS. 4 and 6, the page buffer PB may be controlled by the control logic 1400, and may include a pre-charge circuit 1510, a latch block 1520, and a data input/output circuit 1530. The pre-charge circuit 1510 may be connected with a bit line BL and configured to pre-charge the bit line BL. In the event that the page buffer PB is connected with a pair of bit lines, the pre-charge circuit 1510 may include a function of selecting one of the pair of bit lines. The latch block 1520 may be connected with a sensing node SO. The latch block 1520 may include a plurality of, for example, five latch units 1521 to 1525 (in FIG. 6, represented by S, L, M, F, and C, respectively). The number of latch units included in the page buffer PB is not limited thereto. At a sensing operation (associated with a program verification operation, a read operation, an erase verification operation, etc.), the latch block 1520 may be configured to latch a value of the sensing node SO under the control of the control logic 1400. The control logic 1400 may control the latch block 1520 so as to perform a dump operation where data is transferred between latches. At the dump operation, a phase of data transferred between latches may be inverted or kept, according to the control of the control logic 1400. At a program operation, the latch block 1520 may drive the bit line BL with a bit line program voltage (e.g., 0V or a voltage higher than 0V and lower than a power supply voltage) or a bit line program-inhibition voltage (e.g., a power supply voltage).

As will be described later, the latch block 1520 may perform the above-described bit flip operation (or, an error correcting operation) using error flag information according to the control of the control logic 1400. This may be accomplished by a data transfer operation executed between the latch units 1521 to 1525 according to the control of the control logic 1400. The data input/output circuit 1530 may be configured such that data of the latch block 1520 is sent to a data line DL or data of the data line DL is sent to the latch block 1520.

It may be well comprehended that the structure of the page buffer PB illustrated in FIG. 6 is not limited to this disclosure.

Figure 7:
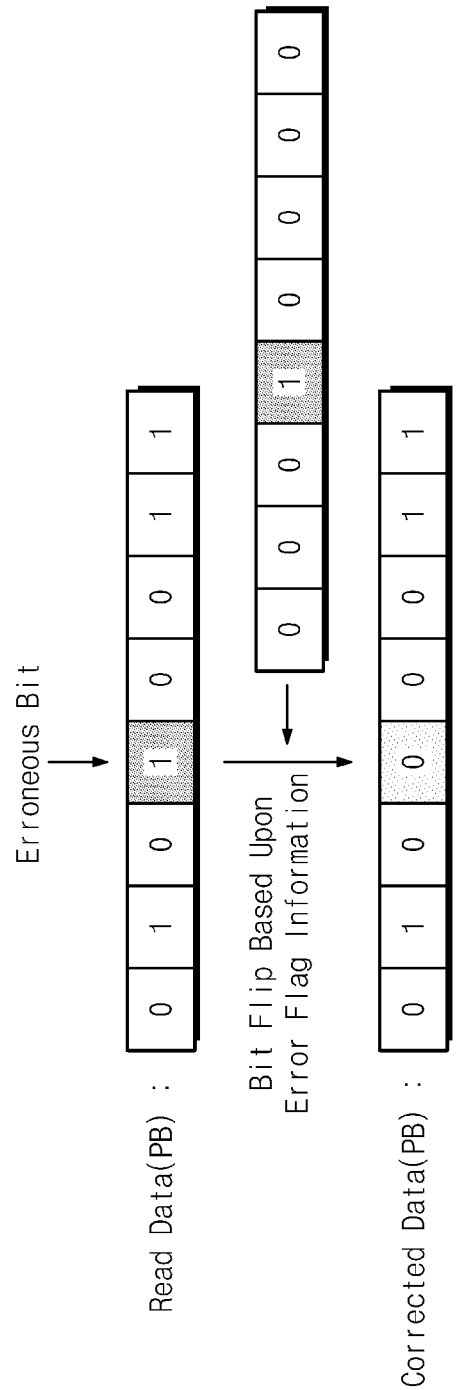
FIG. 7 is a diagram illustrating an error correcting operation of a nonvolatile memory device according to an exemplary embodiment of the inventive concept.

FIG. 7 is a diagram illustrating an error correcting operation of a nonvolatile memory device according to an exemplary embodiment of the inventive concept. Below, an error correcting operation of a nonvolatile memory device according to an exemplary embodiment of the inventive concept will be more fully described with reference to accompanying drawings.

In a case where data read from a first storage region of a memory cell array 1100 is copied to a second storage region thereof, there may be executed error correction associated with the data read from the first storage region. The error correction associated with the data read from the first storage region, as described above, may be made by a nonvolatile memory device 1000, not a memory controller 2000. The error correction may be made according to error flag information provided from the memory controller 2000. For example, the error correction may be executed via a bit flip operation.

As illustrated in FIG. 7, for ease of description, it is assumed that data read from the first storage region of the memory cell array 1100 is 8-bit data of "01010011". Referring to FIGS. 1 through 7, the data read from the first storage region may be transferred to the memory controller 2000. An error detecting and correcting circuit 2500 of the memory controller 2000 may determine whether data provided from the nonvolatile memory device 1000 is erroneous according to an error detection method. Since the error detection method is well known, detail descriptions thereof will be omitted. If data provided from the nonvolatile memory device 1000 is erroneous, the error detecting and correcting circuit 2500 may generate error location information and error flag information. The error location information and the error flag information may be provided to the nonvolatile memory device 1000 under the control of processing unit 2300 of the memory controller 2000. Here, the error flag information may indicate that a data bit corresponding to error location information is erroneous. For example, as illustrated in FIG. 7, error flag information may have a value of '1' when a data bit corresponding to the error location information is erroneous. However, the error flag information may be set to have a value of '0' when a data bit corresponding to the error location information is erroneous.

The error flag information may be stored in the page buffer circuit 1500 of the nonvolatile memory device 1000 independently from data read from the first storage region. An error correcting operation or a bit flip operation may be executed via the page buffer circuit 1500 based upon the error flag information. As illustrated in FIG. 7, a data bit corresponding to error location information may be changed to '0' from '1' according to the error flag information. Data including the changed data bit may be error-corrected data. Afterwards, the error-corrected data may be stored in the second storage region of the memory cell array 1100.

Below, an error correcting operation or a bit flip operation of a page buffer executed according to error flag information will be more fully described.

The error correcting operation (or, the bit flip operation) may be executed using latch units of a page buffer PB. For example, the error correcting operation may be performed via an exclusive-OR (XOR) operation using three latch units 1521, 1522, and 1525. It may be well comprehended that the error correcting operation is not limited to the exclusive-OR operation. For example, the error correcting operation may be executed via an exclusive-NOR (XNOR) operation. The error correcting operation may be performed under the control of control logic 1400.

Data read from the first storage region may be stored in a latch unit 1521 (hereinafter, referred to as an S-latch unit). Data stored in the S-latch unit may be dumped into latch units 1522 and 1525 (hereinafter, referred to as L-latch and C-latch units, respectively). Data stored in the C-latch unit 1525 may be output to a memory controller 2000 for error detection. For ease of description, an error correcting operation will be described on the basis of one data bit. In this case, a combination of one read data bit and an error flag bit may have one of four cases (e.g., '00', '01', '10', and '11'). The following table 1 may represent states of latch units when data is output to the memory controller 2000 for error detection. In the following tables, 'X' may mean don't care (or not operating in the error detection). With the above description, the S-latch unit 1521, the L-latch unit 1522, and the C-latch unit 1525 may have the same state as understood from the following table 1.

TABLE 1

| S-latch | L-latch | M-latch | F-latch | C-latch |
|---|---|---|---|---|
| 1 | 1 | X | X | 1 |
| 1 | 1 | X | X | 1 |
| 0 | 0 | X | X | 0 |
| 0 | 0 | X | X | 0 |

After data is output to the memory controller 2000 from the C-latch unit 1525, the C-latch unit 1525 may be reset to a value of '0'. The memory controller 2000 may perform an error detecting operation on data output from the nonvolatile memory device 1000 to provide error location information and error flag information (or, an error flag bit) as a result of the error detecting operation. The error flag information (or, the error flag bit) may have a value of '1'. Prior to an input of the error flag information, the S-latch unit 1521 may be reset to '0'. The following table 2 may represent cases according to a combination of a value of the L-latch unit 1522 (a value of a read data bit) and a value of the C-latch unit 1525 (error flag information/bit).

TABLE 2

| S-latch | L-latch | M-latch | F-latch | C-latch |
|---|---|---|---|---|
| 0 | 1 | X | X | 1 |
| 0 | 1 | X | X | 0 |
| 0 | 0 | X | X | 1 |
| 0 | 0 | X | X | 0 |

An error correcting operation may be accomplished by inverting a value of the L-latch unit 1522 corresponding to the C-latch unit 1525. This will be more fully described below.

The control logic 1400 may control the page buffer PB to invert an error flag bit loaded onto the C-latch unit 1525 and to store the inverted bit in the S-latch unit 1521. Inversion of the error flag bit may be made when data is dumped to the S-latch unit 1521 from the C-latch unit 1525. The following table 3 may represent a result of this operation.

TABLE 3

| S-latch | L-latch | M-latch | F-latch | C-latch |
|---|---|---|---|---|
| 0 | 1 | X | X | 1 |
| 1 | 1 | X | X | 0 |
| 0 | 0 | X | X | 1 |
| 1 | 0 | X | X | 0 |

The control logic 1400 may control the page buffer PB such that values of the S-latch and L-latch units 1521 and 1522 are changed into '1' when a value of the S-latch unit 1521 is '0' and a value of the L-latch unit 1522 is '0'. The following table 4 may represent a result of this operation.

TABLE 4

| S-latch | L-latch | M-latch | F-latch | C-latch |
|---|---|---|---|---|
| 0 | 1 | X | X | 1 |
| 1 | 1 | X | X | 0 |
| 1 | 1 | X | X | 1 |
| 1 | 0 | X | X | 0 |

The control logic 1400 may control the page buffer PB such that a value of the L-latch unit 1522 is changed into '0' when a value of the S-latch unit 1521 is '0'. The following table 5 may represent a result of this operation.

TABLE 5

| S-latch | L-latch | M-latch | F-latch | C-latch |
|---|---|---|---|---|
| 0 | 0 | X | X | 1 |
| 1 | 1 | X | X | 0 |
| 1 | 1 | X | X | 1 |
| 1 | 0 | X | X | 0 |

Data stored in the L-latch unit 1522 may be error-corrected data. That is, when a read data bit has a value of '1' and a corresponding error flag bit has a value of '1', as understood from the tables 2 to 5, a value of the L-latch unit 1522 may be changed into '0' from '1'. When a read data bit has a value of '0' and a corresponding error flag bit has a value of '1', as understood from the tables 2 to 5, a value of the L-latch unit 1522 may be changed into '1' from '0'

The above-described error correcting operation or bit flip operation may be exemplary, and the inventive concept is not limited thereto. The error correcting operation or the bit flip operation can be changed variously according to a structure of a page buffer, a value of error flag information, etc.

Figure 8:
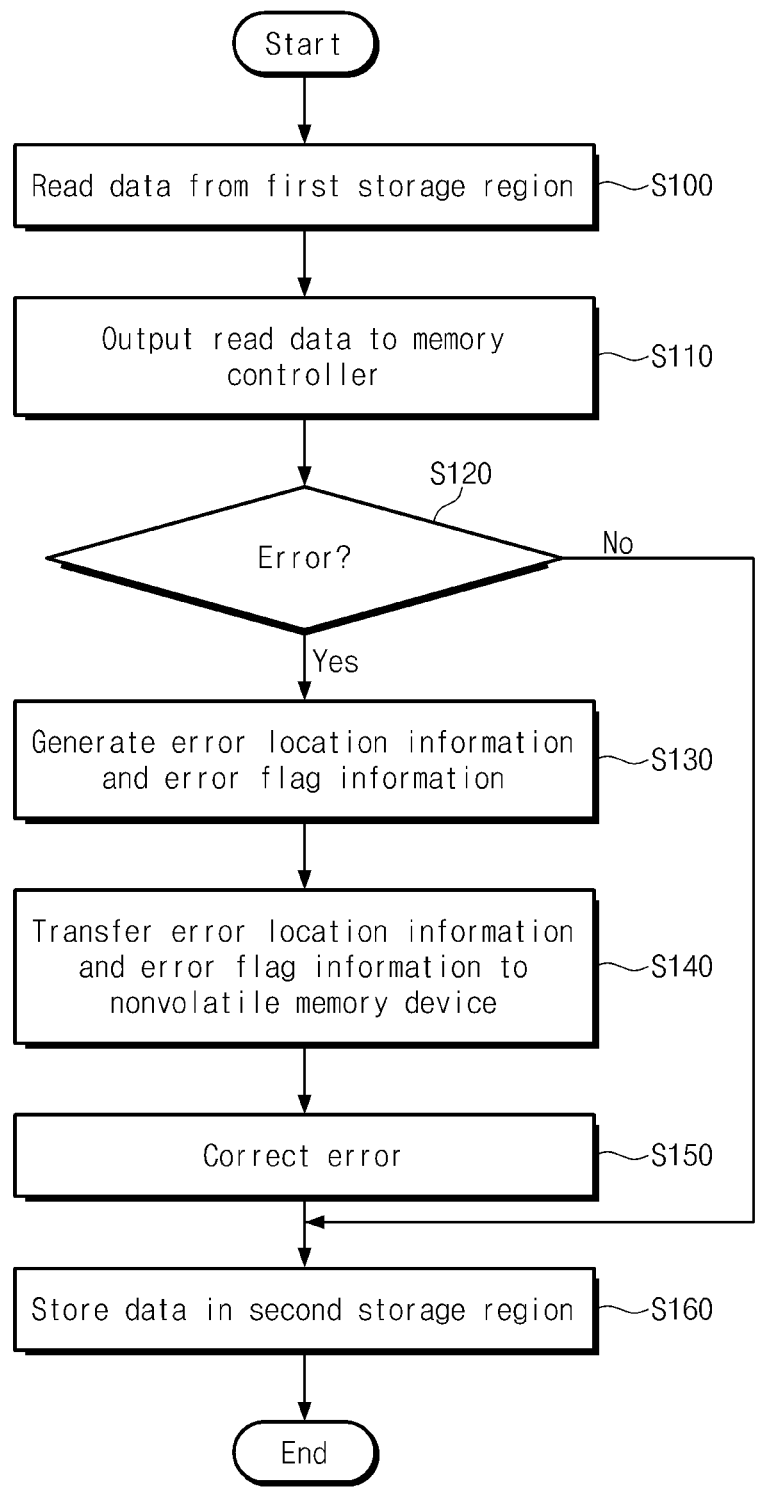
FIG. 8 is a flowchart illustrating a method including a copy operation of a memory system according to an exemplary embodiment of the inventive concept.
Figure 9:
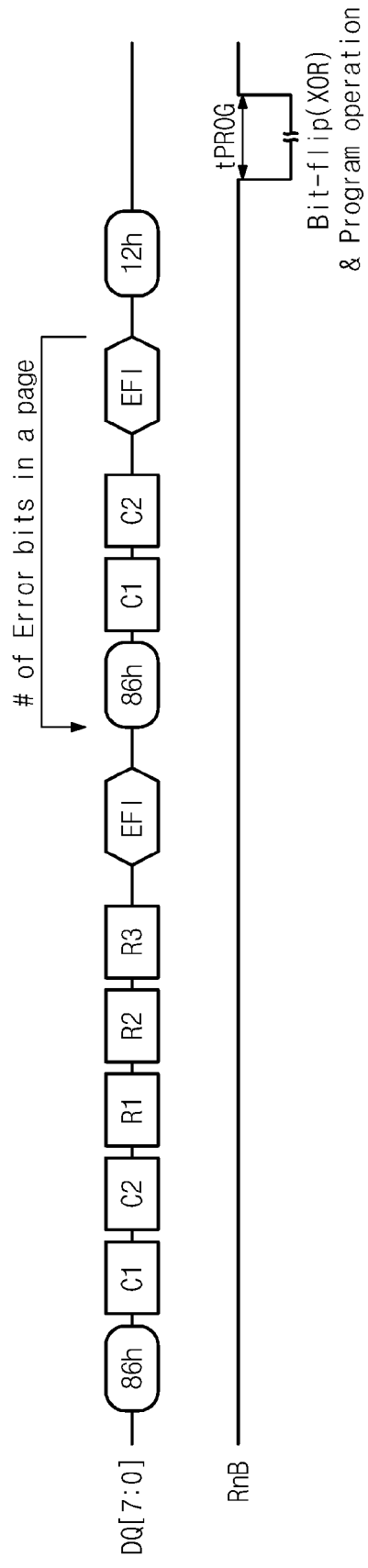
FIG. 9 is a timing diagram illustrating an operation of transferring error flag information to a nonvolatile memory device in the copy operation of FIG. 8.

FIG. 8 is a flowchart illustrating a copy method of a memory system according to an exemplary embodiment of the inventive concept, and FIG. 9 is a timing diagram illustrating an operation of transferring error flag information to a nonvolatile memory device at the copy method of FIG. 8. Below, a copy operation of a memory system according to an exemplary embodiment of the inventive concept will be more fully described with reference to accompanying drawings.

A copy operation may mean an operation where data is copied to a second storage region (e.g., corresponding to a page of a second memory block) of a memory cell array 1100 from a first storage region (e.g., corresponding to a page of a first memory block) of the memory cell array 1100. It may be well comprehended that the term "copy operation" is not limited to a specific operation. For example, the copy operation may include all operations where data is shifted from one storage region to another storage region.

Referring to FIGS. 1 through 9, in operation S100, the page buffer circuit 1500 may read data from a first storage region (or, a selected page) of a first memory block of the memory cell array 1100. The read data may be stored in the S-latch unit 1521 of the page buffer circuit 1500. The read data may include erroneous bits being caused at a read operation. If the read data including erroneous bits is directly stored in a second storage region without error correction, the number of erroneous bits of data stored in the second storage region may exceed a correctable error range of the memory controller 2000. For this reason, error detecting and correcting operations on the read data may be executed. To this end, in operation S110, the read data may be output to the memory controller 2000. As described above, the read data may be dumped to L-latch units 1522 and C-latch units 1525 before it is output to an external device. The read data stored in the C-latch units 1525 may be output to the memory controller 2000.

In operation S120, the memory controller 2000 may determine whether the read data includes one or more erroneous bits. This may be made via an error detecting and correcting circuit 2500 of the memory controller 2000. In this case, it is possible that the memory controller 2000 generates a signal indicating no error bits in at least a portion of the read data and outputs the signal to the nonvolatile memory device 1000 not to perform the correction of the portion of the read data in response to the signal. If the read data is determined not to include erroneous bits, the method proceeds to operation S160. If the read data is determined to include erroneous bits, the error detecting and correcting circuit 2500 may generate error location information and error flag information. The error detecting and correcting circuit 2500 may execute an error detecting operation for generating error location information and error flag information. That is, at the copy operation, the error detecting and correcting circuit 2500 need not perform an error correcting operation. In operation S140, the error location information and the error flag information may be sent to the nonvolatile memory device 1000 from the memory controller 2000. This will be more fully described with reference to FIG. 9.

The read data output from the nonvolatile memory device 1000 may include one or more erroneous bits. The error location information and the error flag information may be sent to the nonvolatile memory device 1000 in a unit of a bit or a bit-by-bit unit corresponding to the error bits of the read data. As illustrated in FIG. 9, error location information corresponding to a first erroneous bit from among erroneous bits may be included in an address C1C2R1R2R3 transferred following a first command 86h, and error flag information EFI may be transferred following the address C1C2R1R2R3. Here, a column address C1C2 of the address C1C2R1R2R3 may include error location information. The address C1C2R1R2R3 may include a row address R1R2R3 to indicate a memory block (or plane/mat) including the first storage region. This sequence may be made in relation to one erroneous bit. Error location information corresponding to each of the remaining erroneous bits may be included in an address C1C2 transferred following the first command 86h, and error flag information EFI thereof may be transferred following the address C1C2. Herein, the address C1C2, that is, a column address C1C2 may include error location information. After error flag information on all erroneous bits is sent to the nonvolatile memory device 1000 according to the timing illustrated in FIG. 9, a second command 12h may be transferred to the nonvolatile memory device 1000 from the memory controller 2000. Afterwards, as will be described below, an error correcting operation (or, a bit flip operation) and a program operation may be carried out in a bit-flip (XOR) and program operation tPROG, for example.

Returning to FIG. 8, in operation S150, the nonvolatile memory device 1000 may execute an error correcting operation (or, a bit flip operation) based on the error flag information provided from the memory controller 2000. The error correcting operation (or, the bit flip operation) may be performed the same as described in relation to tables 2 to 5, and thus description thereof is omitted. In operation S160, error-corrected data may be programmed or stored in the second storage region of the memory cell array 1100. Afterwards, the method may be ended.

With the above description, error detection may be made by the memory controller 2000, and error correction may be made within the nonvolatile memory device 1000. That is, since error correction is not made by the memory controller 2000 after the error detection (or, since error correction is made by the nonvolatile memory device 1000 after the error detection), there may be no need to transfer all data output from the nonvolatile memory device 1000 or corrected data corresponding to the output data to the nonvolatile memory device 1000. This may mean that a time taken to transfer data to the nonvolatile memory device 1000 from the memory controller 2000 or a power consumed to transfer data to the nonvolatile memory device 1000 from the memory controller 2000 is reduced, prevented or avoided.

Figure 10:
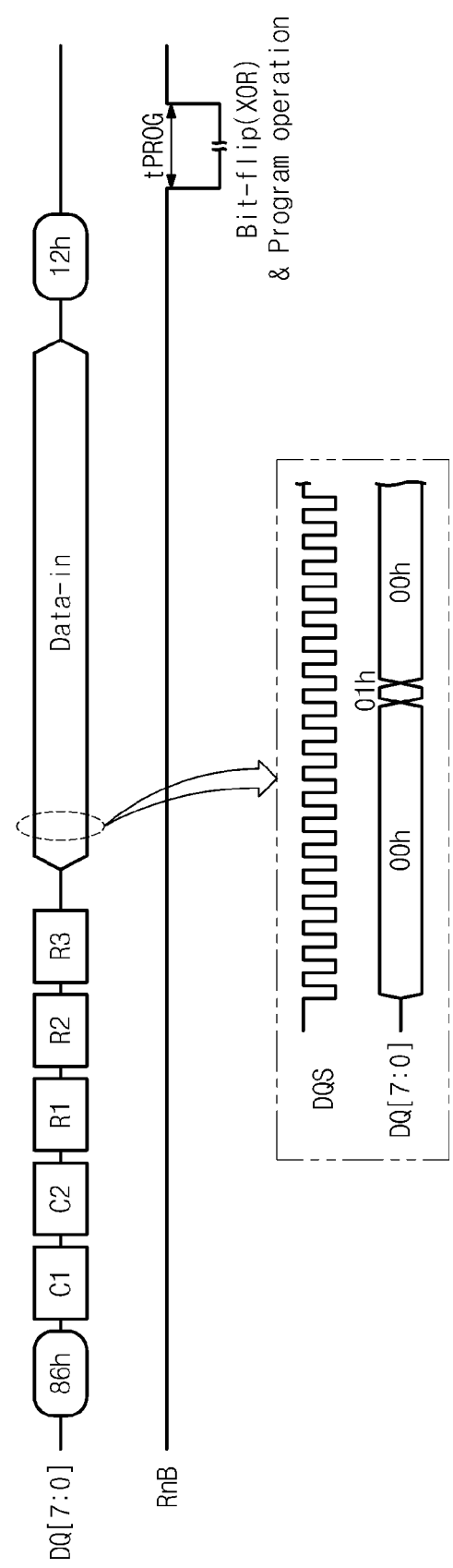
FIG. 10 is a timing diagram illustrating an operation of transferring error flag information to a nonvolatile memory device in the copy operation of FIG. 8 according to an exemplary embodiment of the inventive concept.

FIG. 10 is a timing diagram illustrating an operation of transferring error flag information to a nonvolatile memory device at the copy operation of FIG. 8 according to an exemplary embodiment of the inventive concept.

Unlike a transfer manner in FIG. 9 where error flag information is transferred by an error bit unit, data (hereinafter, referred to as field data) including error flag information (including error flag bits corresponding to error bits, respectively) may be sent to a nonvolatile memory device 1000 following a command 86h and an address C1C2R1R2R3. A size of the field data may be identical to that of read data. In the field data, a value of a location corresponding to error location information may be set to a logic value of '1' (indicating that a logic value is an erroneous bit), and values of the remaining locations may be set to an inverted logic value of '0' (indicating that a logic value is non-error bit). For example, when data is sent to the nonvolatile memory device 1000 from the memory controller 2000 by a byte unit, a location corresponding to error location information may correspond to one (e.g., D1) of eight data bits (e.g., D0 to D7). A bus transition number may be very less according to the transfer manner that field data including error flag information is transferred. This may mean that a power consumed at a data transfer is reduced, prevented or avoided. Further, since error detection is made by a memory controller and error correction is made by a nonvolatile memory device, it is possible to reduce a time taken to transfer data to the nonvolatile memory device from the memory controller or a power consumed to transfer data to the nonvolatile memory device from the memory controller.

Figure 11:
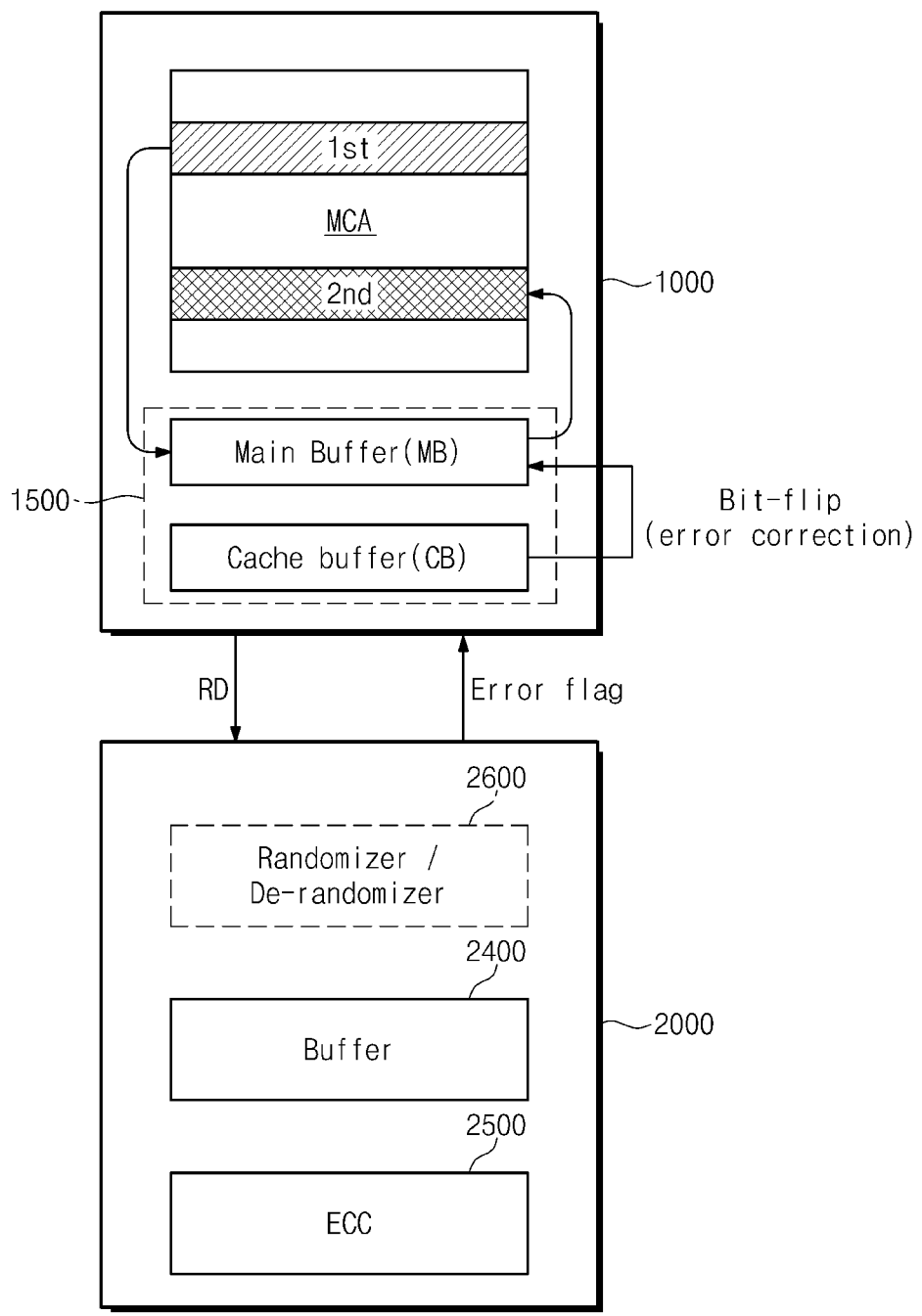
FIG. 11 is a diagram illustrating an error detecting operation and an error correcting operation of a memory system according to an exemplary embodiment of the inventive concept.

FIG. 11 is a diagram illustrating an error detecting operation and an error correcting operation of a memory system according to an exemplary embodiment of the inventive concept.

Data of a first storage region (e.g., corresponding to a page of a first memory block) of a memory cell array MCA may be read by a main buffer MB, and the read data stored in the main buffer MB may be sent to a memory controller 2000 via a cache buffer CB. Herein, the main buffer MB may be formed of one or more S-latch units 1521, and the cache buffer CB may be formed of one or more C-latch units 1525. However, the inventive concept is not limited thereto. The main buffer MB and the cache buffer CB may be included in a page buffer circuit 1500. Data sent to the memory controller 2000 may be de-randomized via a randomizer/de-randomizer 2600. An error detecting and correcting circuit 2500 may perform an error detecting operation associated with the data de-randomized by the randomizer/de-randomizer 2600. Herein, the de-randomized data of the read data RD output from the nonvolatile memory device 1000 may be stored in a buffer memory 2400. As a result of the error detecting operation, error flag information may be transferred to the cache buffer CB of the nonvolatile memory device 1000 from the memory controller 2000. Herein, the error flag information may be transferred to the nonvolatile memory device 1000 from the memory controller 2000 according to a manner described in relation to FIG. 9 or 10. The error flag information or field data including the error flag information may be sent directly to the nonvolatile memory device 1000 without passing through the randomizer/de-randomizer 2600. A bit flip operation (or, an error correcting operation) may be executed based on the error flag information stored in the cache buffer CB, and data corrected via the bit flip operation (or, the error correcting operation) may be stored in a second storage region (e.g., corresponding to one page of a second memory block) of the memory cell array MCA via the main buffer MB. The bit flip operation (or, the error correcting operation) may be executed the same as described in relation to tables 3 to 5, and description thereof is thus omitted.

In an embodiment, error flag information provided from the memory controller 2000 may be loaded onto the cache buffer CB of the page buffer circuit 1500. At this time, the read data may have been stored in the main buffer MB. That is, information loaded onto the cache buffer CB may be a value indicating whether data bits loaded onto the main buffer MB are erroneous.

In an embodiment, a copy operation described in relation to FIG. 11 may be applied to both a memory controller (e.g., corresponding to that in FIG. 3) including the randomizer/de-randomizer 2600 represented by a dotted line and a memory controller (e.g., corresponding to that in FIG. 2) not including the randomizer/de-randomizer 2600 represented by a dotted line. In the memory controller including the randomizer/de-randomizer 2600, if a seed for randomization of the first memory block including the first storage region is identical to a seed for randomization of the second memory block including the second storage region, randomization on the error flag information may not be made.

In an embodiment, a seed value may be stored in memory cells of a region where randomized data is to be stored.

As a copy operation, a copy-back operation (or, a copy-back program operation) is disclosed in U.S. Pat. No. 7,941,586, the entirety of which is incorporated by reference herein.

Figure 12:
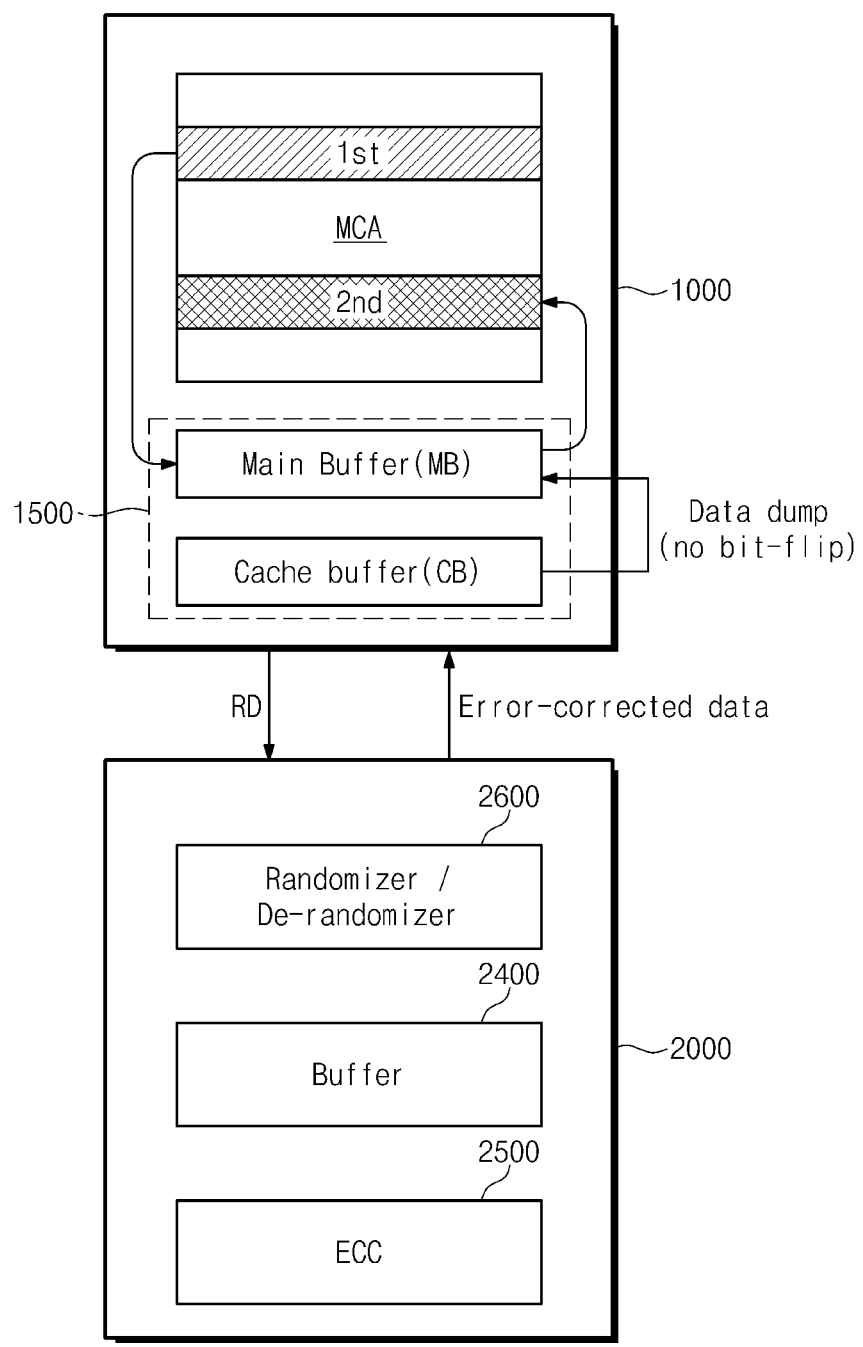
FIG. 12 is a diagram illustrating an error detecting operation and an error correcting operation of a memory system according to an exemplary embodiment of the inventive concept.

FIG. 12 is a diagram illustrating an error detecting operation and an error correcting operation of a memory system according to an exemplary embodiment of the inventive concept.

Data of a first storage region of a memory cell array MCA may be read and then stored in a main buffer MB, and the read data stored in the main buffer MB may be sent to a memory controller 2000 via a cache buffer CB. Herein, the main buffer MB may be formed of one or more S-latch units 1521, and the cache buffer CB may be formed of one or more C-latch units 1525. However, the inventive concept is not limited thereto. Data sent to the memory controller 2000 may be de-randomized via a randomizer/de-randomizer 2600. An error detecting and correcting circuit 2500 may perform an error detecting operation associated with the data de-randomized by the randomizer/de-randomizer 2600. If a seed for randomization of the first storage region of the memory cell array MCA is different from a seed for randomization of a second storage region thereof, the memory controller 2000 may execute both an error detecting operation and an error correcting operation with respect to the read data RD. Herein, the de-randomized data of the read data RD output from the nonvolatile memory device 1000 may be stored in a buffer memory 2400. An error of the read data may be corrected by the error detecting and correcting circuit 2500. The corrected data may be sent to the cache buffer CB of the nonvolatile memory device 1000 via the randomizer/de-randomizer 2600. The error-corrected data stored in the cache buffer CB may be dumped into the main buffer MB, and data (i.e., error-corrected data) dumped into the main buffer MB may be stored in the second storage region of the memory cell array MCA.

A copy operation including an error detecting operation and an error correcting operation is applicable to various memory systems. Below, there will be described an exemplary memory system to which a copy operation including an error detecting operation and an error correcting operation is applied.

Figure 13A:
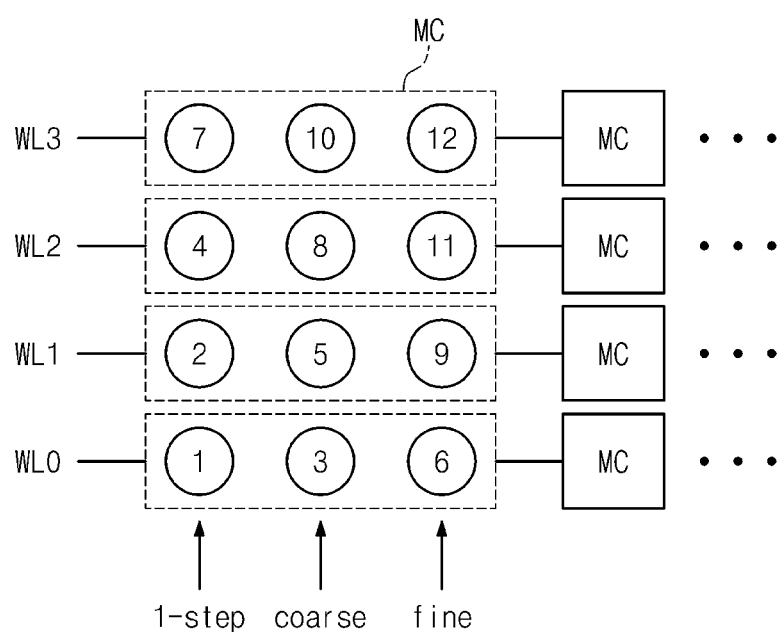
FIG. 13A is a diagram illustrating an example of an address scramble manner applied to a multi-level memory device.

FIG. 13A is a diagram illustrating an address scramble manner applied to a multi-level memory device of a nonvolatile memory device, for example.

With an increase in the number of data bits stored in each memory cell, it is increasingly difficult to secure the reliability of a memory device storing multi-bit (or, multi-level) data, which is referred to as a multi-level memory device hereinafter. A representative one of factors causing degradation of the reliability may be a variation of threshold voltages due to a coupling between adjacent memory cells. For example, a threshold voltage of a previously programmed memory cell may be variable due to the coupling caused when a memory cell adjacent to a programmed memory cell is programmed.

An address scramble manner will be described when 3-bit data is stored in one memory cell. Although FIG. 13A illustrates only four word lines WL0 to WL3, it is possible that a plurality of memory cells MC may be connected with each word line. A 1-step program operation is performed to store lower 2-bit data in each memory cell of the first word line WL0. That is, during the 1-step program operation, 2-page data may be stored in the memory cells connected with the first word line WL0. This is marked by ① in FIG. 13A. A 1-step program operation may also be carried out with respect to memory cells connected with the second word line WL1. This is marked by ② in FIG. 13A. After the 1-step program operation is performed with respect to memory cells connected with the second word line WL1, a coarse program operation (or, a 2-step program operation) may be performed with respect to the first word line WL0 which is placed below the second word line WL1 and in which lower 1-bit data is to be programmed. This is marked by ③ in FIG. 13A.

During the coarse program operation, upper 1-bit data may be stored in memory cells connected with the first word line WL0. Following the coarse program operation of memory cells connected with the first word line WL0, the 1-step program operation may be made with respect to the third word line WL2. This is marked by ④ in FIG. 13A. After the 1-step program operation for the third word line WL2, there may be performed made the coarse program operation during which upper 1-bit data is stored in memory cells connected with the second word line WL1. This is marked by ⑤ in FIG. 1A. Following the coarse program operation for the second word line WL1, a fine program operation may be performed with respect to the first word line WL0. This is marked by ⑥ in FIG. 13A. Afterwards, the 1-step, coarse, and fine program operations may be performed sequentially according to the above-described program order (refer to FIG. 13A). A manner in which word lines are selected according to the program order described in FIG. 13A may be referred to as an address scramble manner. However, the program method is not limited thereto. The program method may be performed according to other manner than the above-described address scramble manner.

If the 1-step program operation and the coarse program operation are completed, all threshold voltage distributions (e.g., $2^M$ threshold voltage distributions) corresponding to M-bit data (M being an integer of 2 or more) may be formed. Although all threshold voltage distributions are formed upon completion of the coarse program operation, it is possible that margins between threshold voltage distributions are insufficient to distinguish threshold voltage distributions from each other. The fine program operation may be carried out to secure margins sufficient to distinguish threshold voltage distributions from each other. The fine program operation may be made to narrow a width of each threshold voltage distribution. During the fine program operation, verification voltages may be used which are higher by a predetermined voltage than verification voltages of threshold voltage distributions used at the coarse program operation. It is possible to reduce the coupling between adjacent memory cells through the above-described program manner, which is referred to as a reprogram method/algorithm.

In an exemplary embodiment, the above-described reprogram method for 3-bit data, that is, the 1-step programming, coarse programming, and fine programming may be applied to a reprogram method of 2-bit data and 4-bit data.

With the reprogram method, it is necessary to retain data stored in memory cells in an arbitrary word line until the fine program operation for the arbitrary word line is completed. For example, the 1-step program operation may be carried out depending upon data provided to a multi-bit memory device from a memory controller, and the coarse program operation may be made depending upon data stored through the 1-step program operation and data provided from the memory controller. The fine program operation may be performed depending upon data stored through the 1-step and coarse program operations. But, as described above, it is difficult to exactly read data stored through the 1-step and coarse program operations. This may mean that data necessary for the fine program operation must be provided to the multi-bit memory device from the memory controller. For this reason, it is necessary for the memory controller to retain data stored in memory cells in an arbitrary word line until the fine program operation for the arbitrary word line is completed. A large buffer memory may be provided within the memory controller to retain data needed for the fine program operation. An On-chip Buffered Programming (OBP) technique, which will be described later, may be applied to a memory system to reduce a size of a buffer memory within the memory controller.

Figure 13B:
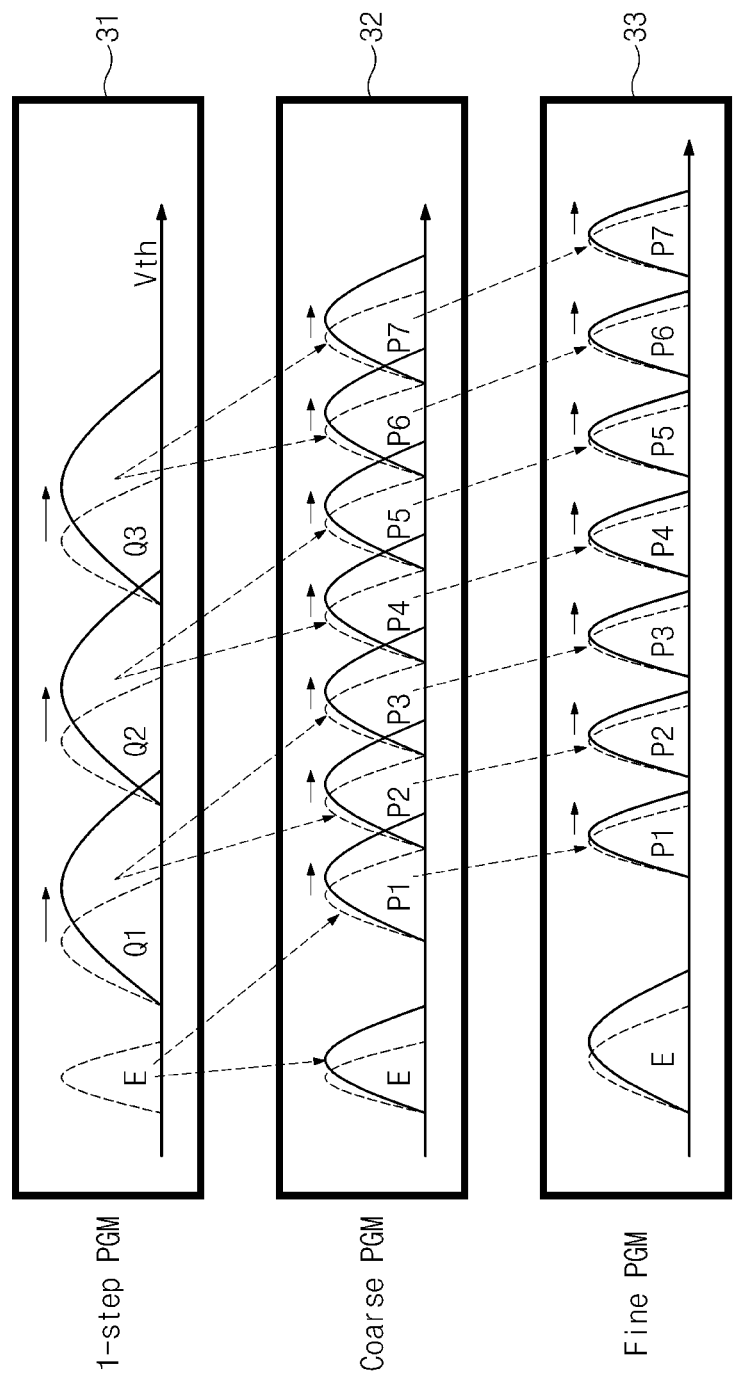
FIG. 13B is a diagram schematically illustrating threshold voltage distributions variable when a program operation is carried out according to a 3-step programming method to store 3-bit data in each memory cell.

FIG. 13B is a diagram schematically illustrating threshold voltage distributions variable when a program operation is carried out according to 3-step programming to store 3-bit data in each memory cell. Below, a program method according to the 3-step programming will be more fully described with reference to accompanying drawings.

Firstly, 2-page data (i.e., first and second pages of data) may be stored in memory cells of a selected word line (e.g., WL0 in FIG. 13A). At this time, as illustrated in a box 31 of FIG. 13B, memory cells in a threshold voltage distribution corresponding to an erase state E may be programmed to have threshold voltages in threshold voltage distributions each corresponding to program states Q1, Q2, and Q3, based on data to be programmed.

As described above, a coarse program operation of 1-step programmed memory cells in a word line (e.g., WL0) may be executed after a 1-step program operation of memory cells in an adjacent word line (e.g., WL1). At this time, as illustrated by a solid line of a box 31 of FIG. 13B, distributions of 1-step programmed memory cells in the word line (e.g., WL0) may widen due to the coupling caused when memory cells in an adjacent word line (e.g., WL1) are programmed.

Then, 1-page data may be stored in memory cells of the selected word line WL0. At this time, as illustrated in a box 32 of FIG. 13B, memory cells in a threshold voltage distribution corresponding to each state may be programmed to have threshold voltages in corresponding threshold voltage distributions. For example, memory cells in a threshold voltage distribution corresponding to an erase state E may be programmed to have threshold voltages in a corresponding threshold voltage distribution to a program state P1, based on data to be programmed. Memory cells in a threshold voltage distribution corresponding to a program state Q1 may be programmed to have threshold voltages in corresponding threshold voltage distributions to program states P2 and P3, based on data to be programmed. Memory cells in a threshold voltage distribution corresponding to a program state Q2 may be programmed to have threshold voltages in corresponding threshold voltage distributions to program states P4 and P5, based on data to be programmed. Memory cells in a threshold voltage distribution corresponding to a program state Q3 may be programmed to have threshold voltages in corresponding threshold voltage distributions to program states P6 to P7, based on data to be programmed.

As described above, a fine program operation of coarse programmed memory cells in a word line (for example, WL0) may be made after a 1-step program operation and a coarse program operation on adjacent word lines (e.g., WL2 and WL1). At this time, as illustrated by a solid line in a box 32 of FIG. 13B, distributions of coarse programmed memory cells in the word line (e.g., WL0) may be widen due to the coupling caused when memory cells in adjacent word lines (e.g., WL2 and WL1) are programmed. For this reason, it may be difficult to exactly read data from coarse programmed memory cells.

Memory cells in the word line WL0 may be programmed to have final threshold voltage distributions as illustrated in a box 33 of FIG. 13B. This operation may be referred to as a fine program operation. As described above, the fine program operation may necessitate previously programmed data (e.g., the first to third pages of data). Since it is difficult to read previously programmed data from memory cells in the word line WL0, the fine program operation will be made based on data provided from a memory controller (or, data maintained by a memory device). As illustrated by a solid line in a box 33 of FIG. 13B, distributions of fine programmed memory cells may widen due to the coupling caused when memory cells in adjacent word lines are programmed.

Afterwards, a 1-step program operation, a coarse program operation, and a fine program operation on each word line will be made according to a program order (or, sequence) described in FIG. 13A, which will be executed in the same manner as described in FIG. 13B.

FIG. 14 is a block diagram schematically illustrating a data storage system 3000 according to an exemplary embodiment of the inventive concept.

Referring to FIG. 14, the data storage system 3000 may include a multi-bit memory device 3100 as a nonvolatile memory device, a memory controller 3200, and a host 3300. The multi-bit memory device 3100 may be formed of one or more memory chips. As a data storage device, the multi-bit memory device 3100 and the memory controller 3200 may be formed as or included in a memory card, a Solid State Drive (SSD), a memory stick, or the like in a single monolithic and/or integrated body. The data storage device may communicate with the host using a wired or wireless communication method to transmit or receive a signal corresponding to data or command, for example. The multi-bit memory device 3100 may include a plurality of memory blocks (or, sectors/banks), each of which has memory cells arranged in rows and columns. Each of the memory cells may store multi-bit (or, multi-level) data. The memory cells may be arranged to have the 2-dimensional array structure or the 3-dimensional/vertical array structure. An exemplary 3-dimensional array structure is disclosed in U.S. Publication Nos. 2008/0023747 and 2008/0084729, the entirety of which is incorporated by reference herein.

Memory blocks of the multi-bit memory device 3100 may be divided into a first region 3101 and a second region 3102. Here, the division of the first and second regions 3101 and 3102 may be made logically, not physically in the multi-bit memory device 3100. The division of the first and second regions 3101 and 3102 can be changed logically. Memory blocks of the first region 3101 may be programmed in a manner different from memory blocks of the second region 3102. For example, memory blocks of the first region 3101 may be programmed according to a first program method, for example, a single-bit program manner (hereinafter, referred to as an SLC program manner), and memory blocks of the second region 3102 may be programmed according to a second program method, for example, a multi-bit program manner or the above-described N-step reprogram manner (hereinafter, referred to as an MLC program manner). In other words, each memory cell of the first region 3101 may store 1-bit data, and each memory cell of the second region 3102 may store a plural-bit data, that is, M-bit data (M being an integer of 3 or more). Further, each memory cell disposed in the first region 3101 may store less data bits in number as compared with M-bit data (M being an integer of 3 or more) stored in each memory cell disposed in the second region 3102.

Referring back to FIG. 14, the memory controller 3200 may be configured to control the multi-bit memory device 3100 in response to a request of the host 3300. The memory controller 3200 may include a buffer memory 3201 and an error detecting and correcting circuit 3202. The buffer memory 3201 may be used to temporarily store data sent from the host 3300 and data read out from the multi-bit memory device 3100. The error detecting and correcting circuit 3202 may be configured to encode data to be stored in the multi-bit memory device 3100 and to decode data read out therefrom. Encoding may include generating parity information, which is generated a field unit. One page of data may be formed of one or more fields. Decoding may include an error detecting operation and an error correcting operation. As described above, the error detecting operation may be performed by the memory controller 3200, and the error correcting operation may be carried out by the multi-bit memory device 3100.

The memory controller 3200 may control a program operation of the memory device 3100 in the static scheduling manner. For example, when data of a minimum program unit for the first region 3101 is stored in the buffer memory 3201, the memory controller 3200 may control the multi-bit memory device 3100 such that data of the minimum program unit is stored (or, programmed) in the first region 3101. This may be referred to as a buffer program operation. If data of a minimum program unit for the second region 3102 is gathered or collected at the first region 3101, the memory controller 3200 may control the multi-bit memory device 3100 such that data of the minimum program unit for the second region 3102 is stored (or, programmed) in the second region 3102. This may be referred to as a main program operation. The buffer program operation and the main program operation may constitute an on-chip buffered program operation.

With an embodiment of the inventive concept, the main program operation may include both error detecting and correcting operations which are carried out before data read out from the first memory region 3101 is copied to the second memory region 3102. The error detecting operation may be made by the memory controller 3200, and the error correcting operation may be executed by the multi-bit memory device 3100. This will be more fully described.

In an exemplary embodiment, the minimum program unit for the first region 3101 and the minimum program unit for the second region 3102 may be determined variously depending upon a program manner, a cell-per-bit number, and the like. The minimum program unit for the first region 3101 may be different from the minimum program unit for the second region 3102.

In an exemplary embodiment, it is possible to minimize a size of the buffer memory 3201 of the memory controller 3200 by storing data in the first region 3101 through the buffer program operation and storing data in the second region 3102 through the main program operation. In other words, it is unnecessary to retain data for a fine program operation in the buffer memory 3201. Accordingly, a size of the buffer memory 3201 of the memory controller 3200 may be minimized.

FIGS. 15A to 15D are diagrams illustrating various combinations on the first and second regions of a multi-bit memory device according to an exemplary embodiment of the inventive concept. In figures, "BP" indicates "buffer programming" to be performed on the first region 3101, and "MP" indicates "main programming" to be performed on the second region 3102.

As described above, a multi-bit memory device 3100 may include a first region 3101 and a second region 3102. Herein, the first and second regions 3101 and 3102 may constitute a memory cell array of the multi-bit memory device 3100. Although not illustrated in figures, the memory cell array may include further regions such as a metadata region, a reserved region, and the like. The regions of the memory cell array may be divided logically, not physically. This may mean that such regions of the memory cell array are defined according to address mapping of a memory controller 3200.

Figure 15A:
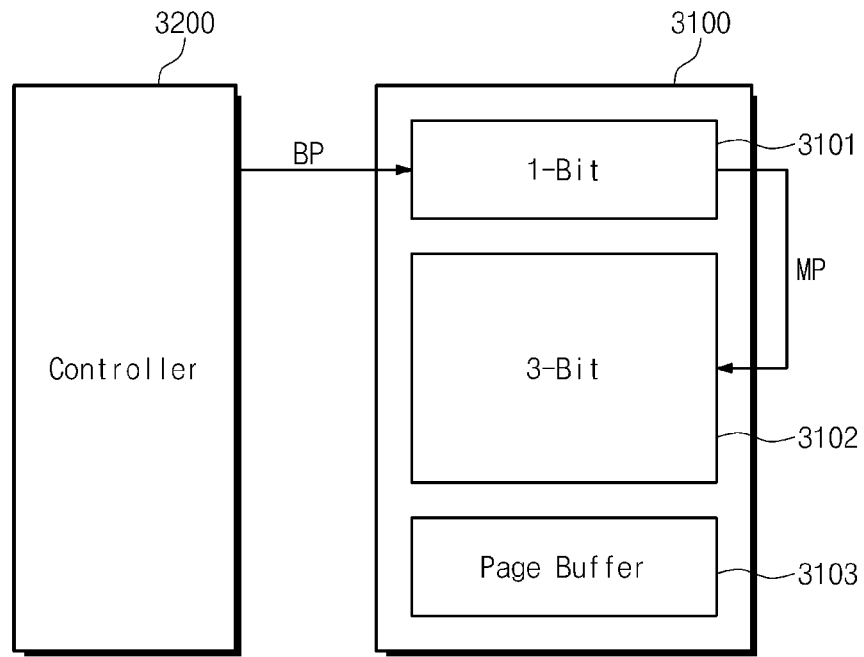
FIGS. 15A to 15D are diagrams illustrating various combinations on first and second regions of a multi-bit memory device according to an exemplary embodiment of the inventive concept.

Referring to FIG. 15A, in a case of a multi-bit memory device which stores 3-bit data per cell, the first region 3101 may be formed of memory cells each storing 1-bit data, and the second region 3102 may be formed of memory cells each storing 3-bit data. In this case, buffer programming may be executed according to an SLC program manner, and main programming may be made according to the above-described MLC program manner.

Figure 15B:
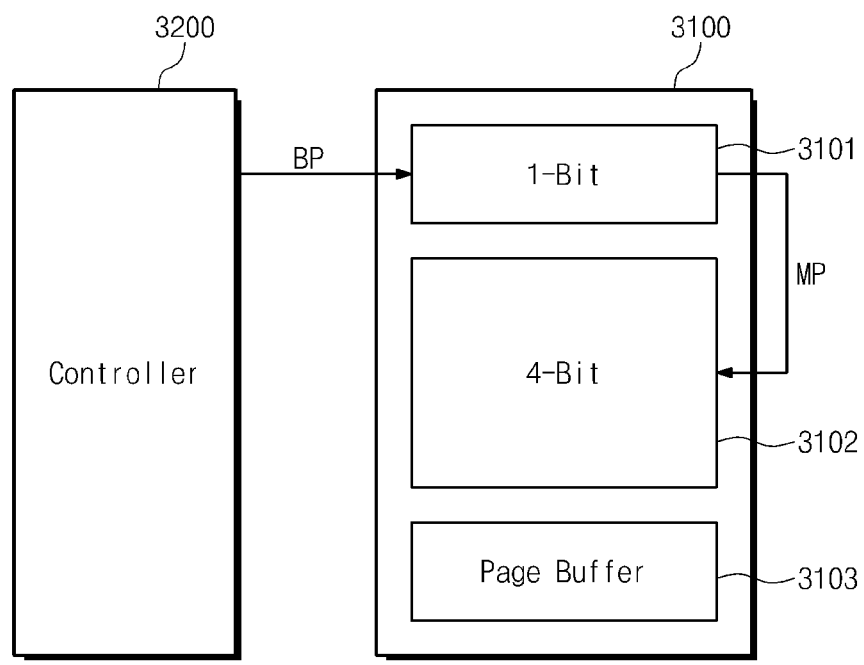

Referring to FIG. 15B, in a case of a multi-bit memory device which stores 4-bit data per cell, the first region 3101 may be formed of memory cells each storing 1-bit data, and the second region 3102 may be formed of memory cells each storing 4-bit data. In this case, buffer programming may be executed according to an SLC program manner, and main programming may be made according to the above-described MLC program manner.

Figure 15C:
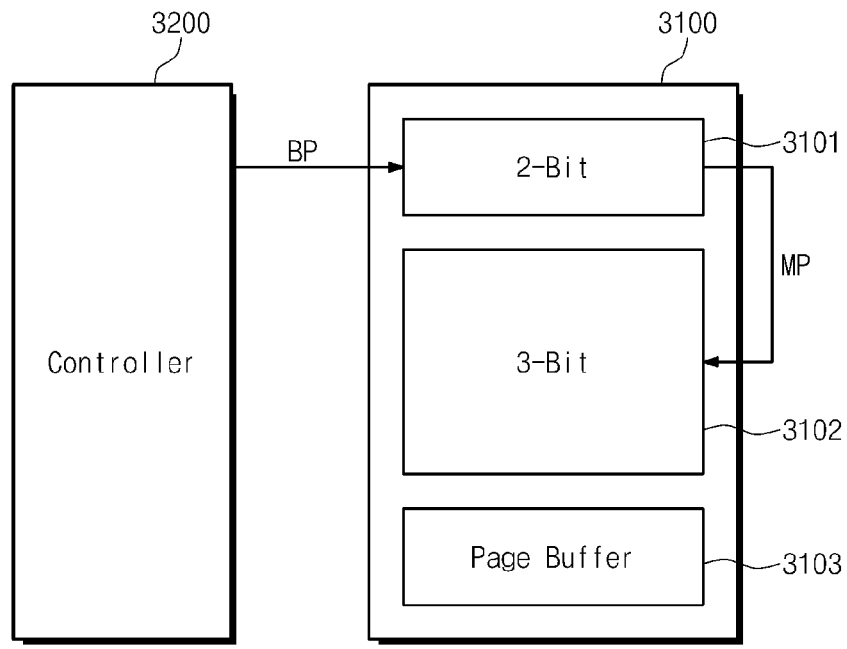

Referring to FIG. 15C, in a case of a multi-bit memory device which stores 3-bit data per cell, the first region 3101 may be formed of memory cells each storing 2-bit data, and the second region 3102 may be formed of memory cells each storing 3-bit data. In this case, buffer programming may be executed according to the above-described or conventional MLC program manner, and main programming may be made according to the above-described MLC program manner (e.g., a reprogram manner).

Figure 15D:
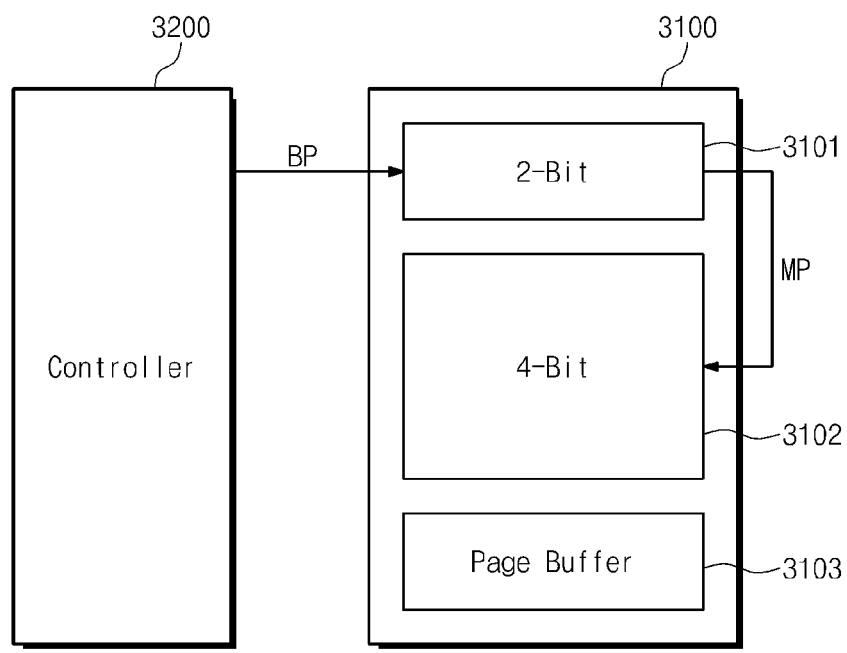

Referring to FIG. 15D, in a case of a multi-bit memory device which stores 4-bit data per cell, the first region 3101 may be formed of memory cells each storing 2-bit data, and the second region 3102 may be formed of memory cells each storing 4-bit data. In this case, buffer programming may be executed according to the above-described or conventional MLC program manner, and main programming may be made according to the above-described MLC program manner (e.g., a reprogram manner).

In an exemplary embodiment, FIGS. 15A to 15D illustrate the multi-bit memory device 3100 to define the first and second regions 3101 and 3102. However, the present general inventive concept is not limited thereto. For example, if a storage medium included in a data storage system is formed of a plurality of multi-bit memory devices, the first and second regions 3101 and 3102 can be defined with respect to the respective multi-bit memory devices. Alternatively, the first region 3101 can be defined with respect to any one of the multi-bit memory devices. Alternatively, any one multi-bit memory device can be defined as the first region 3101.

Figure 16:
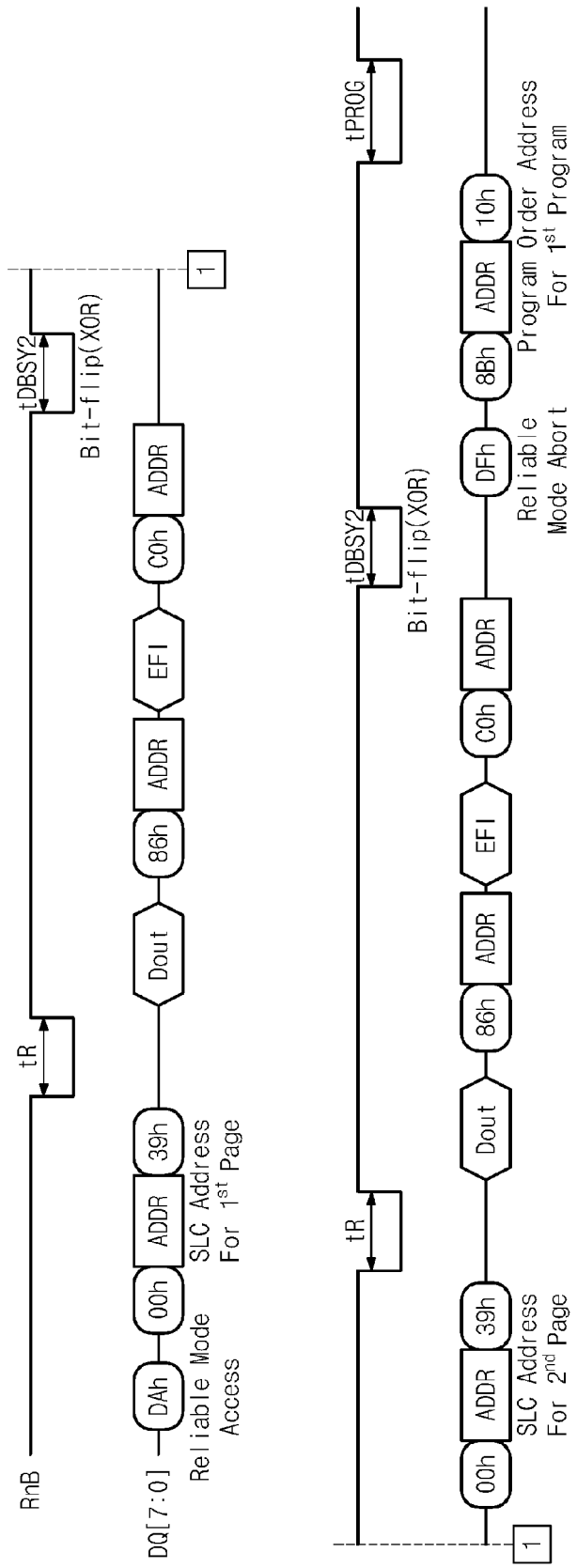
FIG. 16 is a diagram illustrating a command sequence for a 1-step program operation according to an exemplary embodiment of the inventive concept.
Figure 17:
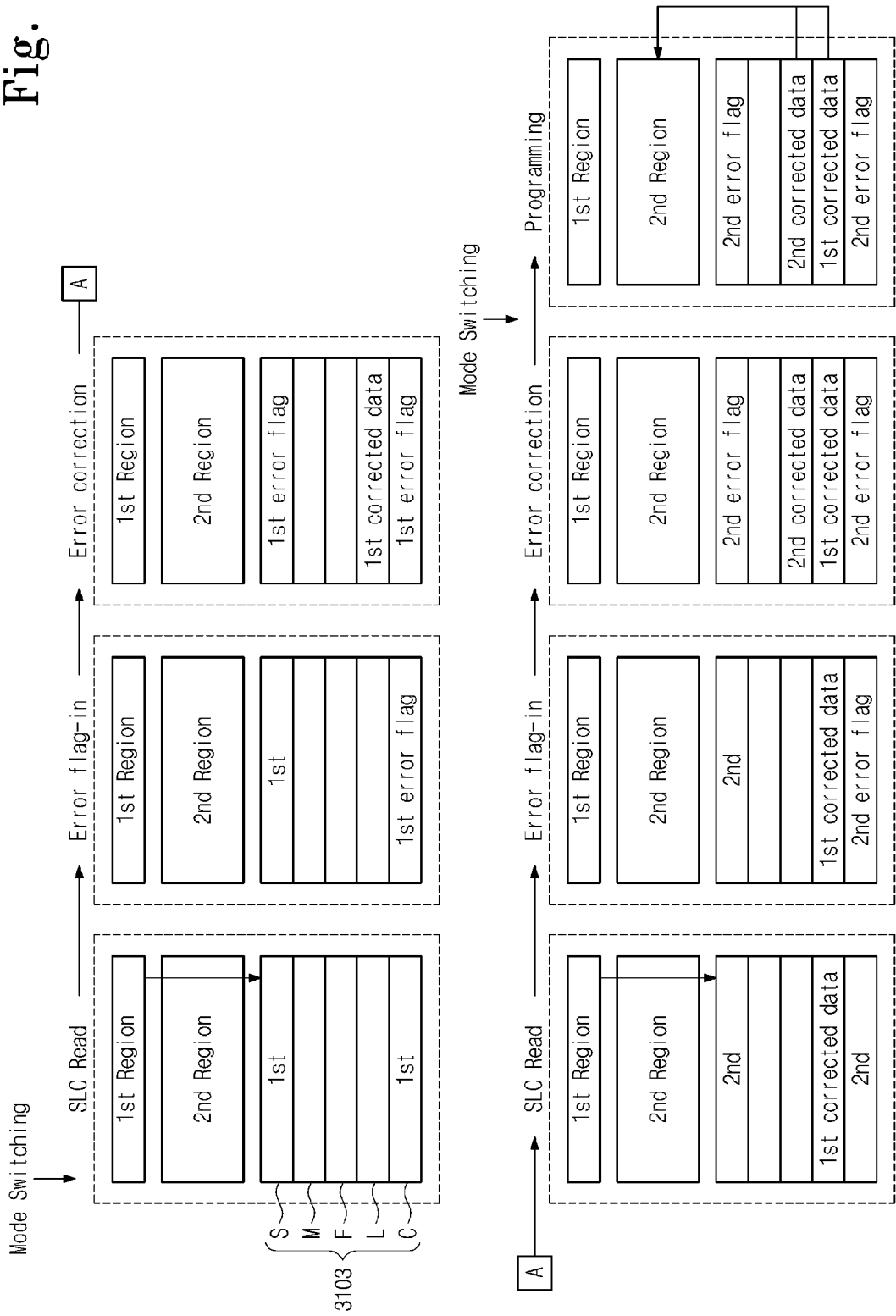
FIG. 17 is a diagram schematically illustrating a data flow according to a 1-step program command sequence of FIG. 16.
Figure 18:
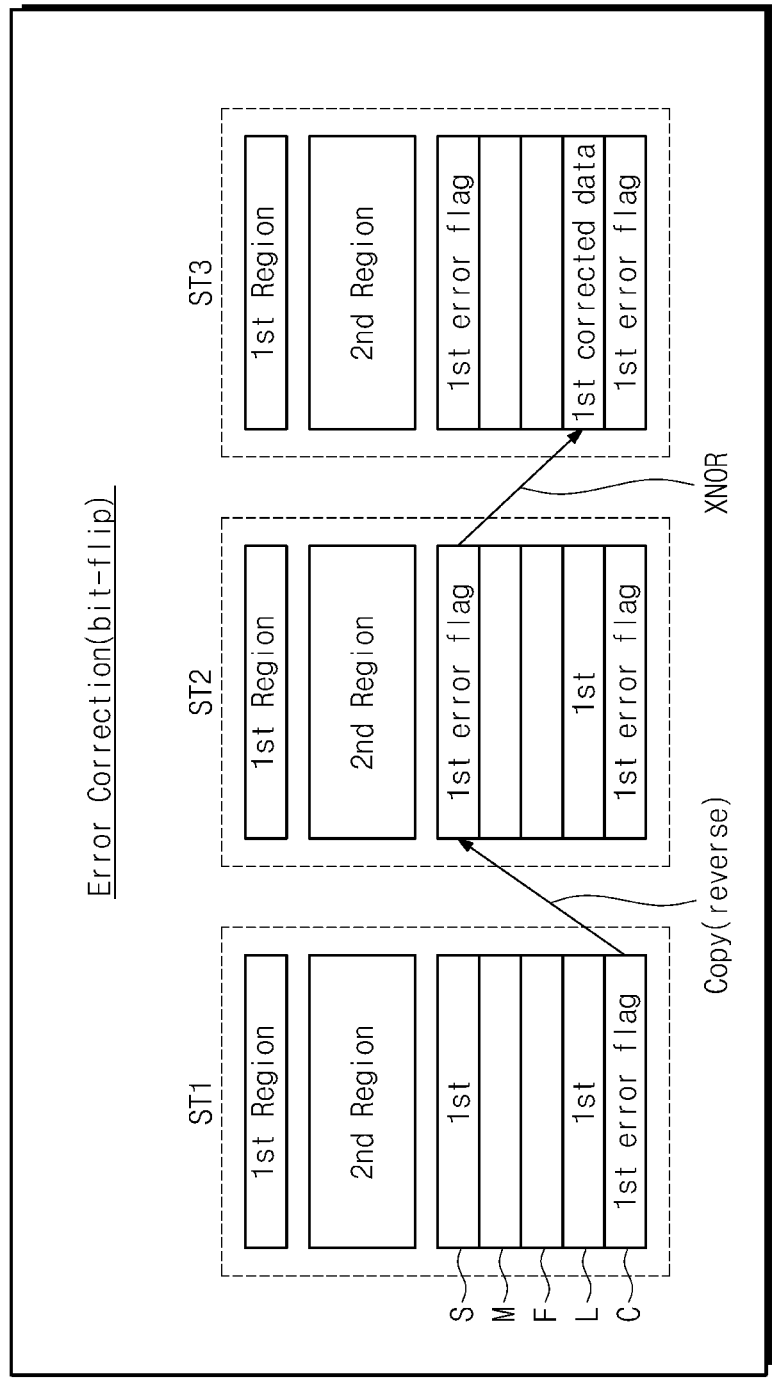
FIG. 18 is a diagram schematically illustrating a data flow according to an error correcting operation (or, a bit flip operation).

FIG. 16 is a diagram illustrating a command sequence for a 1-step program operation according to an exemplary embodiment of the inventive concept. FIG. 17 is a diagram schematically illustrating a data flow according to the 1-step program command sequence of FIG. 16. FIG. 18 is a diagram schematically illustrating a data flow according to an error correcting operation (or, a bit flip operation). Below, an operation of a data storage system according to an exemplary embodiment of the inventive concept will be more fully described with reference to accompanying drawings.

A 1-step program operation may be executed when a minimum program unit (e.g., 2-page) on a second memory region 3102 is stored in a first memory region 3101. As a main program operation, the 1-step program operation of the second memory region 3102 may accompany two SLC read operations on the first memory region 3101 and one MLC program operation on the second memory region 3102. Each SLC read operation may include an error detecting operation and an error correcting operation described above.

For a data storage system 3000 according to an exemplary embodiment of the inventive concept, prior to execution of the 1-step program operation, a command DAh for switching into an SLC mode of operation may be sent to a multi-bit memory device 3100. When the command DAh for mode switching is input, the multi-bit memory device 3100 may recognize a command provided from a memory controller 3200 as a command associated with an SLC operation.

Following the command DAh for mode switching, as illustrated in FIG. 16, the memory controller 3200 may send a set of command 00h, address ADDR, and command 39h to the multi-bit memory device 3100. At this time, the address ADDR may be an address for indicating or designating a page of two pages of data. After the command 39h is input, a page buffer 3103 of the multi-bit memory device 3100 may read first data from the first memory region 3101 as illustrated in FIG. 17. The read data may be stored in S-latch units. During the read operation, as illustrated in FIG. 16, the multi-bit memory device 3100 may set a ready/busy signal RnB to indicate a busy state. After the read operation is completed, the multi-bit memory device 3100 may set the ready/busy signal RnB to indicate a ready state.

As illustrated in FIG. 16, the read data may be output to the memory controller 3200 from the multi-bit memory device 3100. Prior to an output of the read data, data of the S-latch units may be dumped into C-latch units. Data dumped into the C-latch units may be output to the memory controller 3200. The memory controller 3200 may perform an error detecting operation in the same manner as described above, and may generate error location information and error flag information as a result of the error detecting operation. After the error detecting operation is executed, the memory controller 3200 may send a set of command 86h, address ADDR, and data EFI to the multi-bit memory device 3100. Herein, the data EFI may include error flag information, and may be loaded onto the C-latch units as illustrated in FIG. 17. The error flag information may be transferred according to a manner described in relation to FIG. 9 or 10. In a case of the manner described in relation to FIG. 9, although not illustrated therein, an error flag input sequence (86h, ADDR, EFI) illustrated in FIG. 16 may be repeated by the number of erroneous bits.

When the error flag information is transferred, the memory controller 3200 may send a set of command C0h and address ADDR to the multi-bit memory device 3100. Herein, the command C0h may be a command to correspond to execution of the above-described bit flip operation (or, error correcting operation), and the address ADDR may be an address to indicate or designate a latch unit in which error-corrected data is to be stored. The ready/busy signal RnB may be set to a busy state following the input of the command C0h and the address ADDR. During the busy state of the ready/busy signal RnB, the above-described bit flip operation (or, error correcting operation) may be executed.

Referring to FIG. 18 which shows a data flow according to the bit flip operation (or, error correcting operation), in operation ST1, error flag information provided from the memory controller 3200 may be loaded onto the C-latch units. In operation ST2, the error flag information loaded onto the C-latch units may be dumped into the S-latch units. At this time, data dumped to the S-latch units from the C-latch units may be inverted. In operation ST3, data of the S-latch units may be dumped into L-latch units via an exclusive-NOR (XNOR) operation. At this time, data dumped into the L-latch units may be data error corrected by the XNOR operation. A location in which the error-corrected data is being stored, that is, the L-latch units may be indicated or designated by the address ADDR input with the command C0h. The above-described inverting (or, reverse) and XNOR operations may constitute an exclusive-OR (XOR) operation corresponding to the bit flip operation. The above-described operations (i.e., including error flag loading, inverting of error flag information, and an XNOR operation) may be executed according to the same manner as described in relation to tables 2 to 5, and description thereof is thus omitted.

Returning to FIG. 16, when the error correcting operation (or, the bit flip operation) is completed, the multi-bit memory device 3100 may set the ready/busy signal RnB to indicate a ready state. The memory controller 3200 may respond to a state of the ready/busy signal RnB to send a set of command 00h, address ADDR, and command 39h to the multi-bit memory device 3100. At this time, the address ADDR may be an address to indicate or designate the remaining page of two pages of data needed for the 1-step program operation. After the command 39h is input, the page buffer 3103 of the multi-bit memory device 3100 may read data from the first memory region 3101 as illustrated in FIG. 17. The read data may be stored in the S-latch units. During the read operation, as illustrated in FIG. 16, the multi-bit memory device 3100 may set the ready/busy signal RnB to indicate a busy state. After the read operation is completed, the multi-bit memory device 3100 may set the ready/busy signal RnB to indicate a ready state. The ready/busy signal RnB include a signal tR and/or tDBSY2 as illustrated in FIG. 16.

As illustrated in FIG. 16, the read data may be output to the memory controller 3200 from the multi-bit memory device 3100. Prior to an output of the read data, data of the S-latch units may be dumped into C-latch units as illustrated in FIG. 17. Data dumped into the C-latch units may be output to the memory controller 3200. The memory controller 3200 may perform an error detecting operation in the same manner as described above, and may generate error location information and error flag information as a result of the error detecting operation. After the error detecting operation is executed, the memory controller 3200 may send a set of command 86h, address ADDR, and data EFI to the multi-bit memory device 3100. Herein, the data EFI may include error flag information, and may be loaded onto the C-latch units as illustrated in FIG. 17. The error flag information may be transferred according to a manner described in relation to FIG. 9 or 10. In case of the manner described in relation to FIG. 9, although not shown in figures, an error flag input sequence (86h, ADDR, EFI) illustrated in FIG. 16 may be repeated by the number of erroneous bits.

When the error flag information is transferred, the memory controller 3200 may send a set of command C0h and address ADDR to the multi-bit memory device 3100. The ready/busy signal RnB may be set to a busy state following the input of the command C0h and the address ADDR. During the busy state of the ready/busy signal RnB, the above-described bit flip operation (or, error correcting operation) described in relation to FIG. 18 may be executed. The error-corrected data may be stored in F-latch units indicated or designated by the address ADDR input with the command C0h.

Once data needed for the 1-step program operation is prepared, the 1-step program operation associated with the second memory region 3102 may be performed. Prior to execution of the 1-step program operation, the memory controller 3200 may send a command DFh for mode switching to the multi-bit memory device 3100. The command DFh may be a command for exiting from a mode for the SLC operation. As the command DFh is input, the multi-bit memory device 3100 may recognize a command provided from the memory controller 3200 as a command associated with a main program operation, for example, an MLC operation.

Afterwards, the memory controller 3200 may send a set of command 8Bh, address ADDR, and command 10h to the multi-bit memory device 3100 as illustrated in FIG. 16. At this time, the address ADDR may be an address for appointing one of pages to be 1-step programmed. Since data needed for the 1-step program operation is prepared in a page buffer 3103, no data may be sent to the multi-bit memory device 3100 from the memory controller 3200. After the command 10h is input, data stored in the page buffer 3103 may be programmed in the second memory region 3102 as illustrated in FIG. 17. During the program operation, as illustrated in FIG. 16, the multi-bit memory device 3100 may set the ready/busy signal RnB to indicate a busy state. After the program operation is ended, the multi-bit memory device 3100 may set the ready/busy signal RnB to indicate a ready state.

Figure 19:
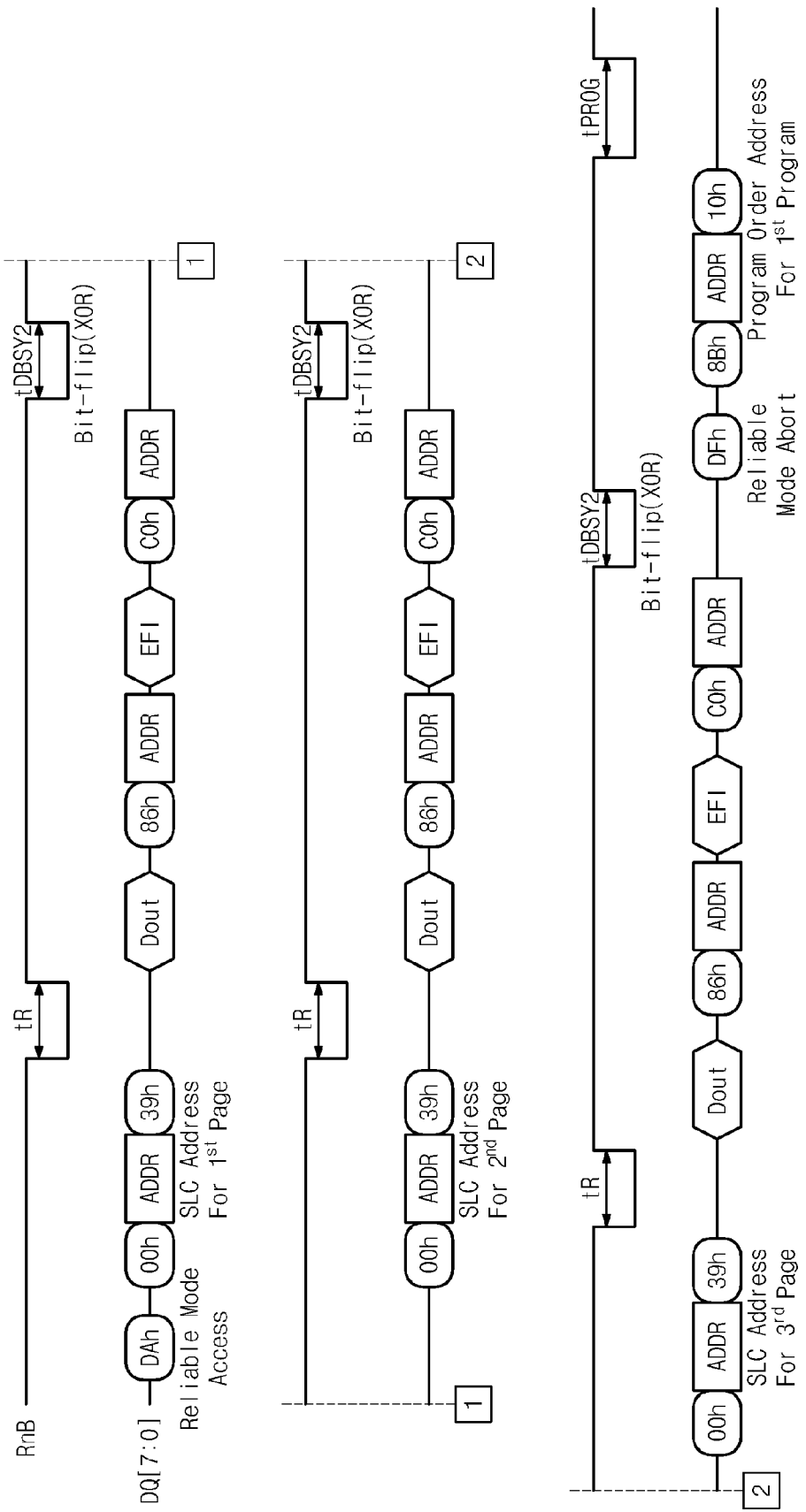
FIG. 19 is a diagram illustrating a command sequence for a coarse program operation according to an exemplary embodiment of the inventive concept.
Figure 20:
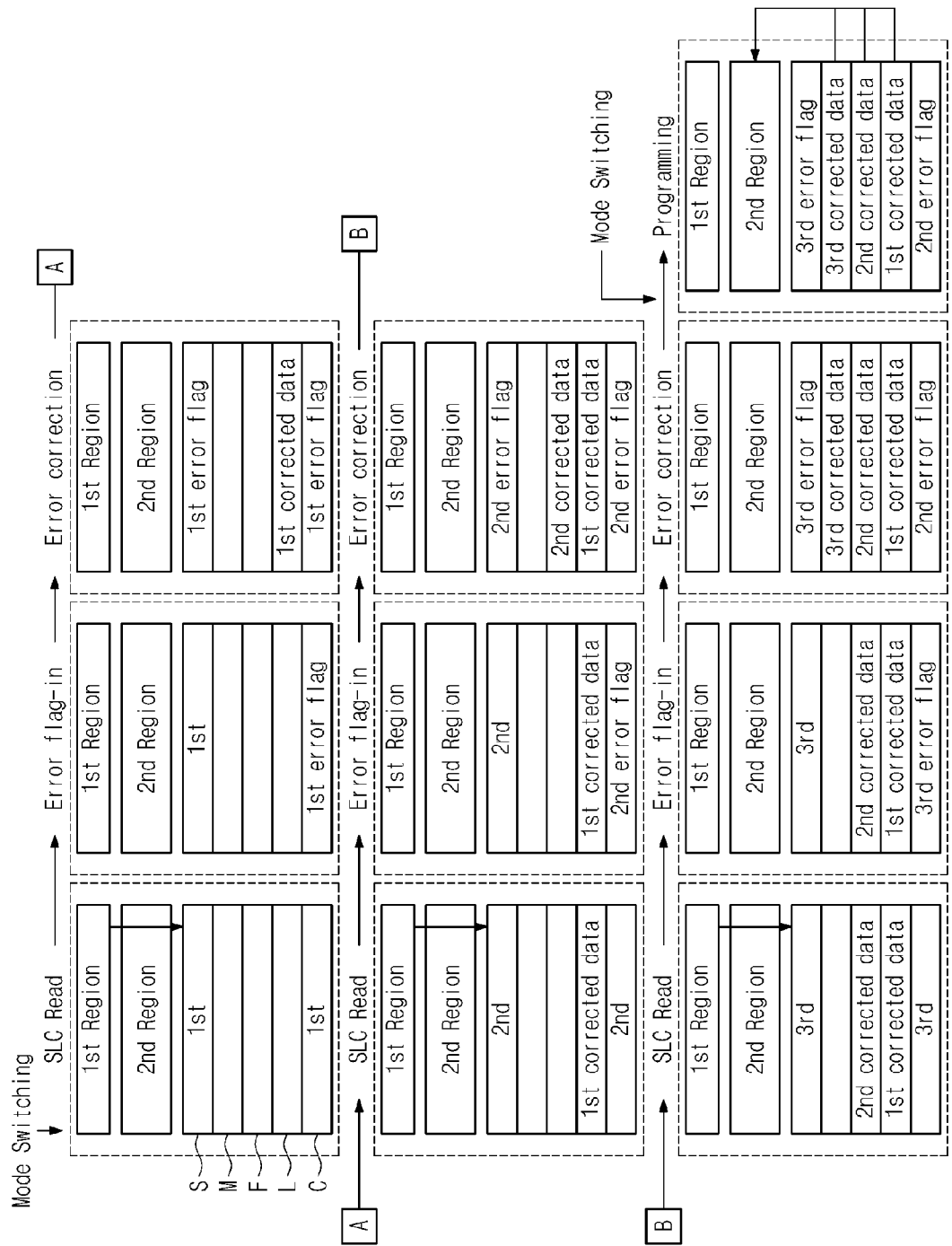
FIG. 20 is a diagram schematically illustrating a data flow according to a coarse program command sequence of FIG. 19.

FIG. 19 is a diagram illustrating a command sequence for a coarse program operation according to an exemplary embodiment of the inventive concept. FIG. 20 is a diagram schematically illustrating a data flow according to a coarse program command sequence illustrated in FIG. 19. Below, an operation of a data storage system according to an exemplary embodiment of the inventive concept will be more fully described with reference to accompanying drawings.

Prior to description, a coarse program operation may be executed when a minimum program unit (e.g., 3-page) on a second memory region 3102 is stored in a first memory region 3101. The coarse program operation of the second memory region 3102 may accompany three SLC read operations on the first memory region 3101 and one MLC program operation on the second memory region 3102. Each SLC read operation may include an error detecting operation and an error correcting operation described above.

As illustrated in FIG. 20, each SLC read operation may be executed the same as described in relation to FIGS. 16 to 18, and description thereof is thus omitted. Prior to execution of a first SLC read operation, a memory controller 3200 may send a command DAh for mode switching to a memory controller 3200 as illustrated in FIG. 19. An MLC program operation on the second memory region 3102 may be performed the same as described in relation to FIGS. 16 to 18 except that 3-bit data is stored in the second memory region 3102, and description thereof is thus omitted. Prior to execution of the coarse program operation, the memory controller 3200 may send a command DFh for mode switching to the memory controller 3200 as illustrated in FIG. 19. Although not illustrated therein, a fine program operation as a main program operation may be executed identically according to a command sequence illustrated in FIG. 19.

Although a 1-step program operation and a coarse program operation are illustrated in relation to FIGS. 16 to 20, the present general inventive concept is not limited thereto. That is, an on-chip buffered program manner is not limited thereto. It is possible that other program manner can be usable in the copy operation.

Figure 21:
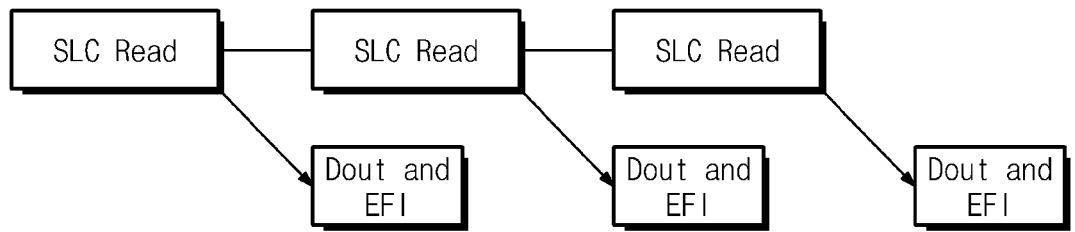
FIG. 21 is a diagram schematically illustrating a data flow at a coarse/fine program operation in a memory system according to an embodiment of the inventive concept.

At a coarse/fine program operation or a fine program operation, three SLC read operations may be executed continuously. In this case, data read via a first SLC read operation can be output to a memory controller 3200 while a second SLC read operation is executed. The memory controller 2000 may generate error flag information during execution of the second SLC read operation. FIG. 21 illustrates a data flow at a coarse/fine program operation according to an embodiment of the inventive concept. When SLC read operations are performed continuously, a data output operation and an error flag generating operation associated with a previous SLC read operation may be performed during a time when a next SLC read operation.

When the data includes a plurality of pages having at least a first page and a second page, the memory controller may repeatedly receive the data such that first error information is determined and output in response to the first page and such that second error information is determined and output in response to the second page. Accordingly, the nonvolatile memory device may repeatedly read the data when receiving the error location information and output the read data to the memory controller upon receiving the error location information of at least a portion of the read data. It is possible that the nonvolatile memory device simultaneously reads the data from the memory and receives the error location information from the memory controller.

The nonvolatile memory device may include a buffer circuit to simultaneously store the read data and the received error location information. It is possible that the nonvolatile memory device includes a main buffer to store the read data and a cache buffer to receive the error location information to correct the stored data in the main buffer according to the error location information.

It is possible that the nonvolatile memory device may include a main buffer to communicate with the first region and the second region to store the read data and the corrected data, and a cache buffer to communicate with the controller to receive the error location information. The main buffer may store the corrected data in the second region according to the error location information.

The nonvolatile memory device repeats the reading the data when receiving the error location information on at least a portion of the previously read data from the memory controller. It is possible that the nonvolatile memory device repeats the reading of the data to be stored therein and be output to the memory controller until receiving the error location information corresponding to all of the read data. The nonvolatile memory device may perform a flipping operation of flipping a bit of the read data according to the error location information to generate the corrected data to be stored in an operation to store data of a first memory region into a second memory region.

Figure 22:
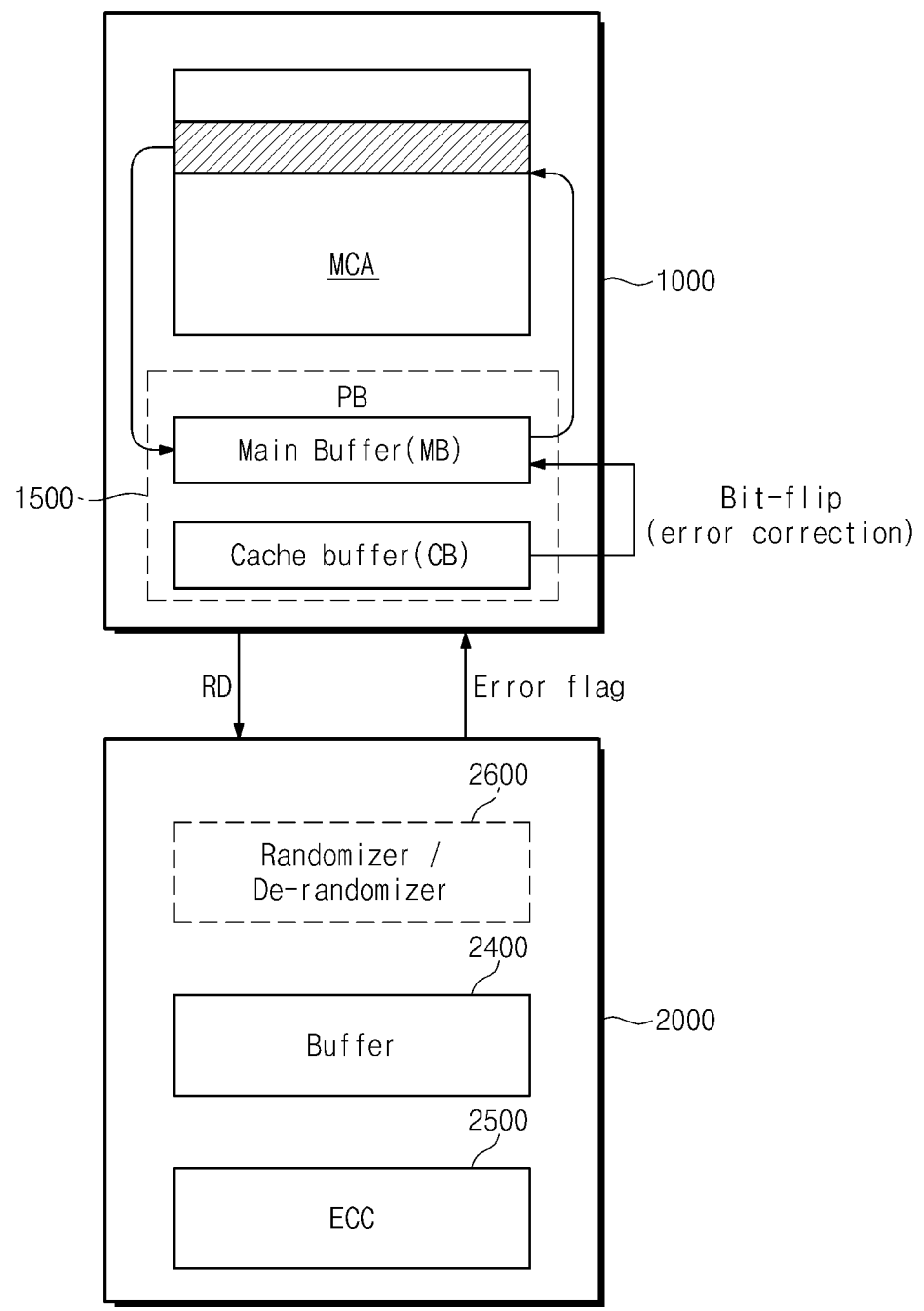
FIG. 22 is a diagram illustrating a refresh program operation of a memory system according to an exemplary embodiment of the inventive concept.

FIG. 22 is a diagram illustrating a refresh program operation of a memory system according to an exemplary embodiment of the inventive concept.

Iterative program/erase cycles may force or cause a stress to memory transistor oxide films, and the stress may make tunnel oxide films of memory transistors be broken down. Threshold voltages of memory cells may lower due to the stress. That is, electrons may be leaked from charge storing layers of programmed memory cells. This may make a threshold voltage distribution of programmed memory cells be shifted toward a low voltage, so that memory cells each having a threshold voltage lower than a program verification voltage are generated. This may mean that a read fail is caused due to reduction of a read margin. It is possible to reprogram memory cells each having a threshold voltage lower than a program verification voltage before the read fail is caused. This operation may be referred to as a refresh program operation.

Referring to FIG. 22, at a reprogram/refresh program operation, first, data may be read out from a specific page of a memory cell array MCA via a main buffer MB of a page buffer circuit 1500. The read data stored in the main buffer MB may be sent to a memory controller 2000 via a cache buffer CB. Herein, the main buffer MB may be formed of S-latch units 1521, and the cache buffer CB may be formed of C-latch units 1525. However, the inventive concept is not limited thereto. The main buffer MB and the cache buffer CB may constitute a page buffer circuit 1500.

Data sent to the memory controller 2000 may be de-randomized via a randomizer/de-randomizer 2600. An error detecting and correcting circuit 2500 may perform an error detecting operation associated with the data de-randomized by the randomizer/de-randomizer 2600. Herein, the de-randomized data of the read data RD output from the nonvolatile memory device 1000 may be stored in a buffer memory 2400. As a result of the error detecting operation, error flag information may be transferred to the cache buffer CB of the nonvolatile memory device 1000 from the memory controller 2000. Herein, the error flag information may be transferred to the nonvolatile memory device 1000 from the memory controller 2000 according to a manner described in relation to FIG. 9 or 10. The error flag information or field data including the error flag information may be sent directly to the nonvolatile memory device 1000 without passing through the randomizer/de-randomizer 2600. A bit flip operation (or, an error correcting operation) may be executed based on the error flag information stored in the cache buffer CB, and data corrected via the bit flip operation (or, the error correcting operation) may be stored in the specific page (i.e., a location from which data is read is identical to a location in which data is being stored) of the memory cell array MCA via the main buffer MB. That is, there may be executed a reprogram operation associated with data read from a specific page. In other words, the bit flip operation (or, the error correcting operation) may be executed the same as described in relation to tables 3 to 5, and description thereof is thus omitted.

Further and detailed description of the refresh program operation is disclosed in U.S. Pat. No. 7,697,359, and the entirety of which is incorporated by reference herein.

Figure 23:
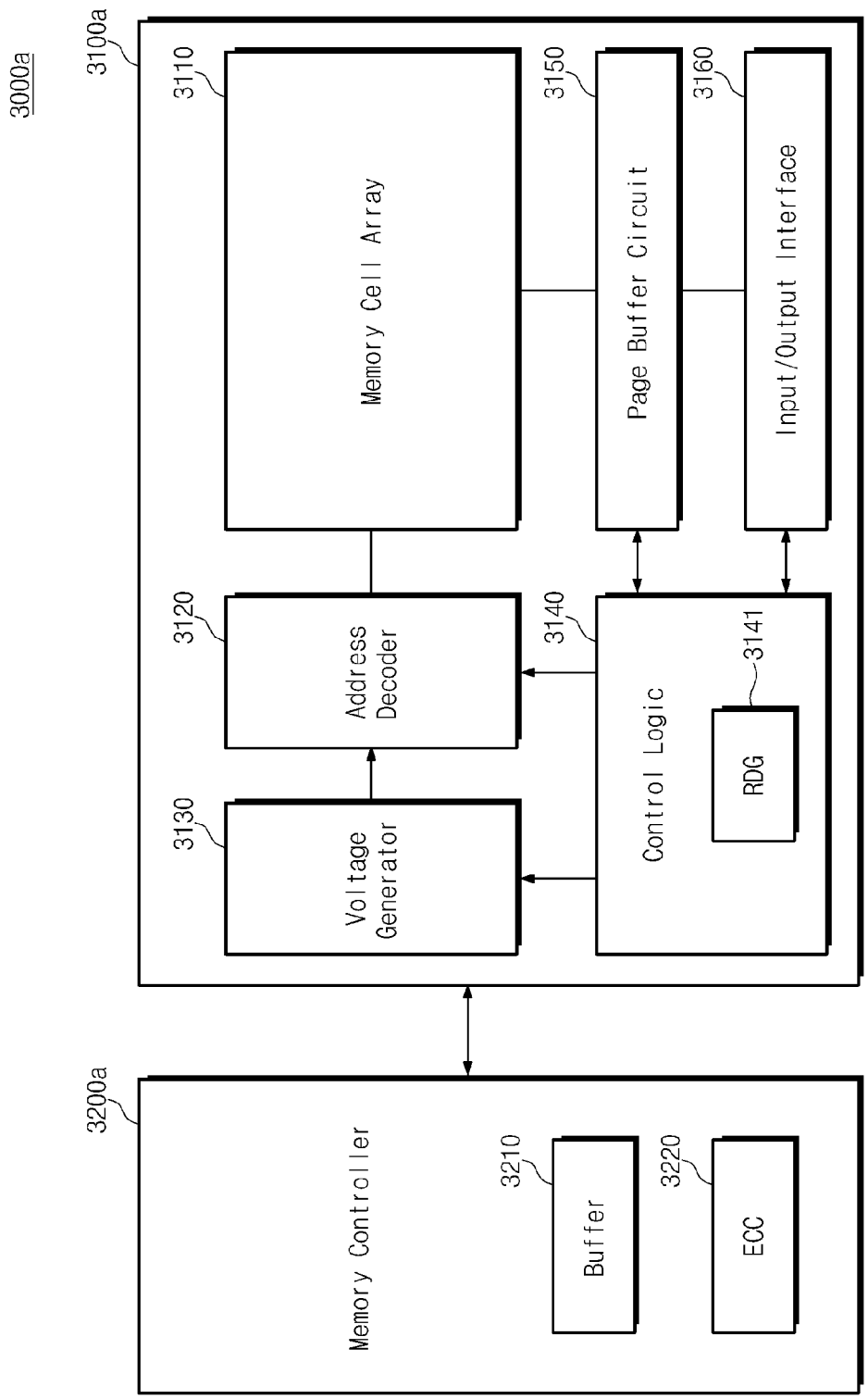
FIG. 23 is a block diagram schematically illustrating a memory system according to an exemplary embodiment of the inventive concept.

FIG. 23 is a block diagram schematically illustrating a memory system 3000a according to an exemplary embodiment of the inventive concept. Referring to FIG. 23, the memory system 3000a may include a nonvolatile memory device 3100a and a memory controller 3200a.

The nonvolatile memory device 3100a may include a memory cell array 3110, a row decoder circuit 3120, a voltage generator circuit 3130, control logic 3140, a page buffer circuit 3150, and an input/output interface 3160. In FIG. 23, the memory cell array 3110, the row decoder circuit 3120, and the voltage generator circuit 3130 may be substantially identical to those illustrated in FIG. 4, and description thereof is thus omitted. The control logic 3140 may be configured to control an overall operation of the nonvolatile memory device 3100a. The control logic 3140 may include a random sequence data generator 3141 (in FIG. 23, represented by RDG). The random sequence data generator 3141 may generate random sequence data using a seed value. The random sequence data may be transferred to the page buffer circuit 3150 via the input/output interface 3160.

The page buffer circuit 3150 may perform an exclusive-OR (XOR) operation on program data and random sequence data under the control of the control logic 3140. This may mean that the program data is randomized within the page buffer circuit 3150. Further, the page buffer circuit 3150 may perform the XOR operation on data read from the memory cell array 3110 and random sequence data. This may mean that the read data (or, randomized read data) is de-randomized within the page buffer circuit 3150. The page buffer circuit 3150 may execute the above-described error correcting operation (or, a bit flip operation) under the control of the control logic 3140. Herein, data randomization may be made prior to error correction, or data randomization may be made following error correction.

The memory controller 3200a may include a buffer memory 3210 and an error detecting and correcting circuit 3220. The buffer memory 3210 may be configured to temporarily store data read from the nonvolatile memory device 3100a. The error detecting and correcting circuit 3220 may detect an error of data read from the nonvolatile memory device 3100a, and may generate error location information and error flag information as a result of the error detecting operation. This may be made substantially the same as described above, and description thereof is thus omitted. The error location information and the error flag information may be sent to the nonvolatile memory device 3100a in a manner described in relation to FIG. 9 or 10.

Accordingly, error detection may be made by the memory controller 3200a, and error correction and data randomization/de-randomization (or, on-chip randomization/de-randomization) may be made by the nonvolatile memory device 3100a.

Figure 24:
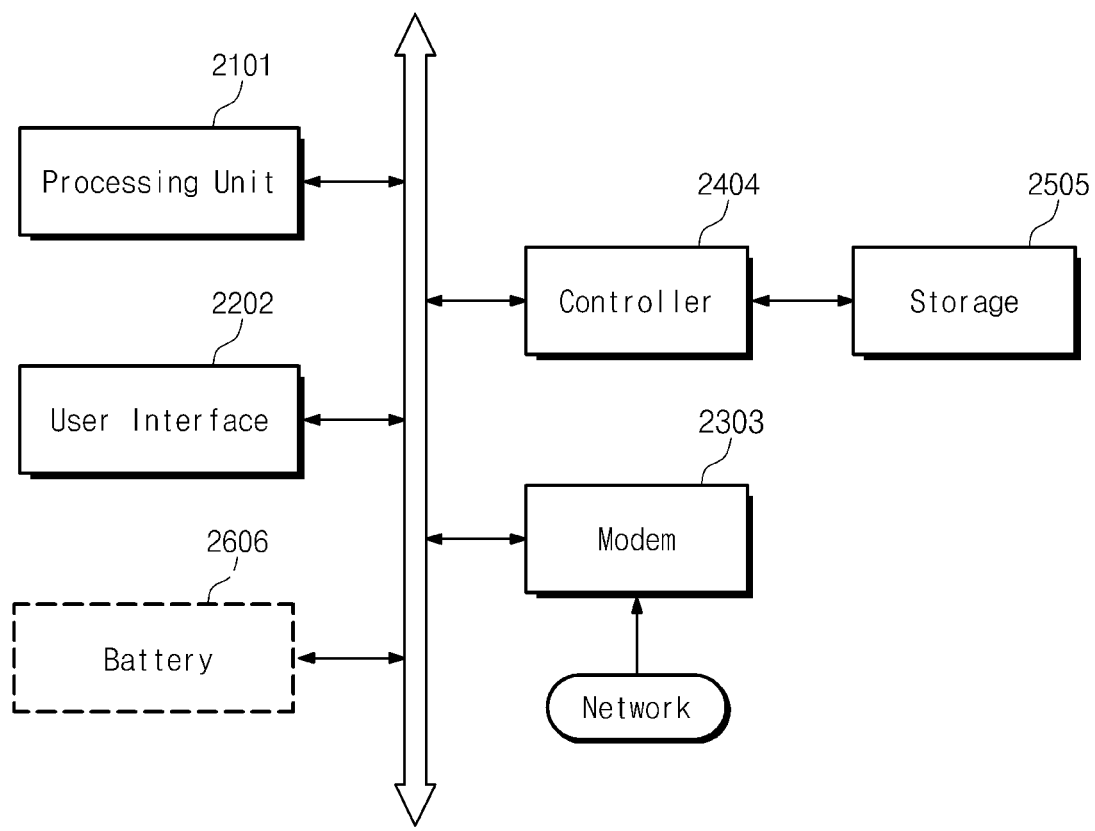
FIG. 24 is a block diagram schematically illustrating a computing system according to an exemplary embodiment of the inventive concept.

FIG. 24 is a block diagram schematically illustrating a computing system according to an exemplary embodiment of the inventive concept.

The computing system may include a microprocessor 2101, a user interface 2202, a modem 2303 such as a baseband chipset, a memory controller 2404, and a nonvolatile memory device 2505 as a storage medium. The memory controller 2404 and the nonvolatile memory device 2505 may be configured the same as those illustrated in FIG. 1 or 14. That is, since error detection is made by the memory controller 2404 and error correction is made within the nonvolatile memory device 2505, it is possible to reduce a time taken to transfer data to the nonvolatile memory device 2505 from the memory controller 2404 or a power consumed to transfer data to the nonvolatile memory device 2505 from the memory controller 2404.

N-bit data (N being an integer of 1 or more) processed/to be processed by the microprocessor 2101 may be stored in the nonvolatile memory device 2505 through the memory controller 2404. In the event that the computing system is a mobile device, a battery 2606 may be further included in the computing system to supply an operating voltage thereto. Although not illustrated in figures, the computing system may further comprise an application chipset, a camera image processor (CIS), a mobile DRAM, and the like.

Figure 25:
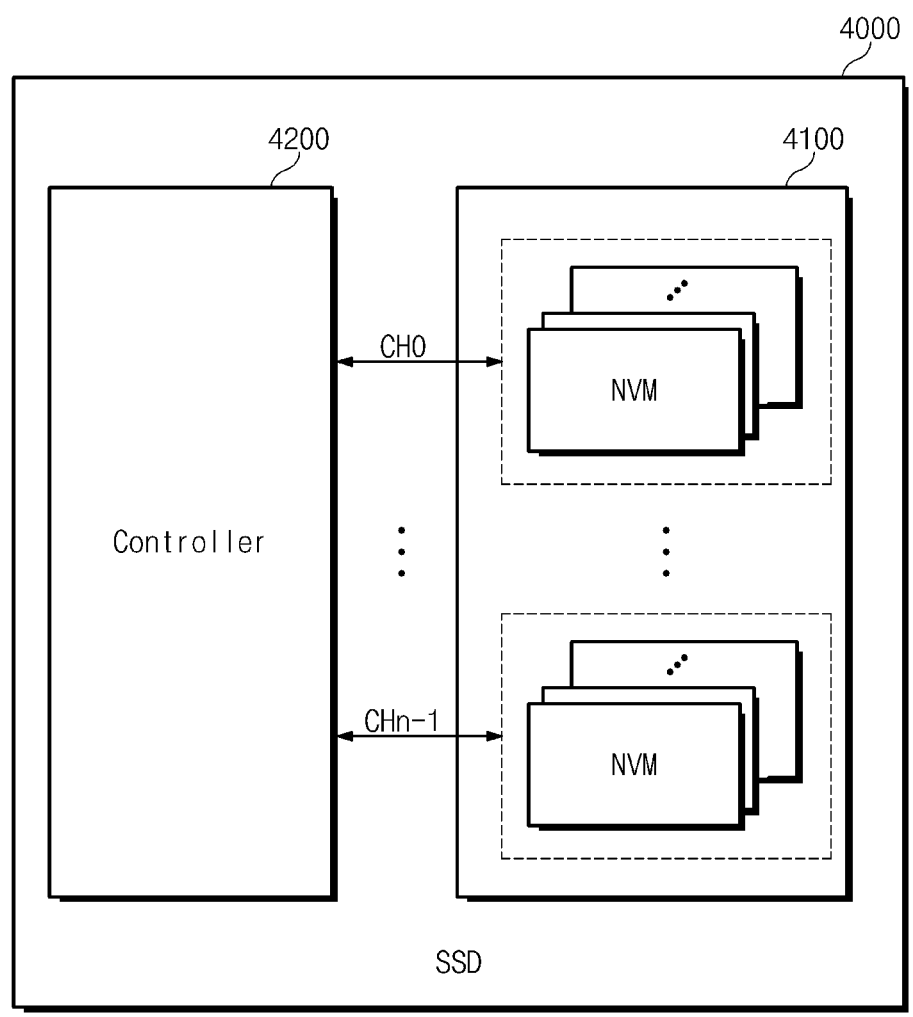
FIG. 25 is a block diagram showing a solid state drive according to an exemplary embodiment of the inventive concept.

FIG. 25 is a block diagram illustrating a solid state drive 4000 according to an exemplary embodiment of the inventive concept.

Referring to FIG. 25, the solid state drive (SSD) 4000 may include a storage medium 4100 and a controller 4200. The storage medium 4100 may be connected with the controller 4200 via a plurality of channels, each of which is commonly connected with a plurality of nonvolatile memory devices of the storage medium 4100. Each nonvolatile memory device of the storage medium 4100 may be formed of the nonvolatile memory 1000 illustrated in FIG. 1. The controller 4200 may be configured to control the storage medium 4100 according to any one of manners described with reference to FIGS. 1 to 19. That is, since error detection is made by the memory controller and error correction is made within the nonvolatile memory device, it is possible to reduce a time taken to transfer data to the nonvolatile memory device from the memory controller or a power consumed to transfer data to the nonvolatile memory device from the memory controller.

Figure 26:
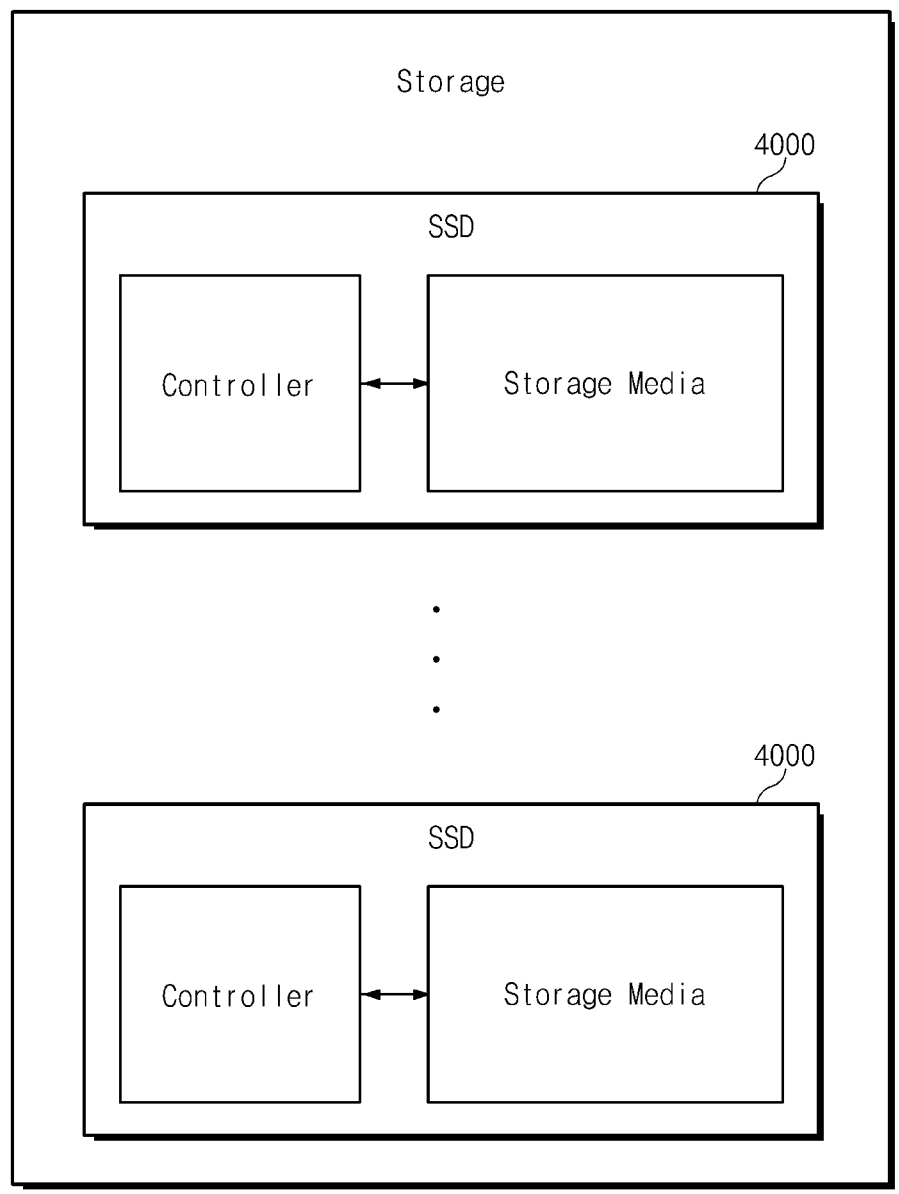
FIG. 26 is a block diagram illustrating a storage using the solid state drive of FIG. 25.
Figure 27:
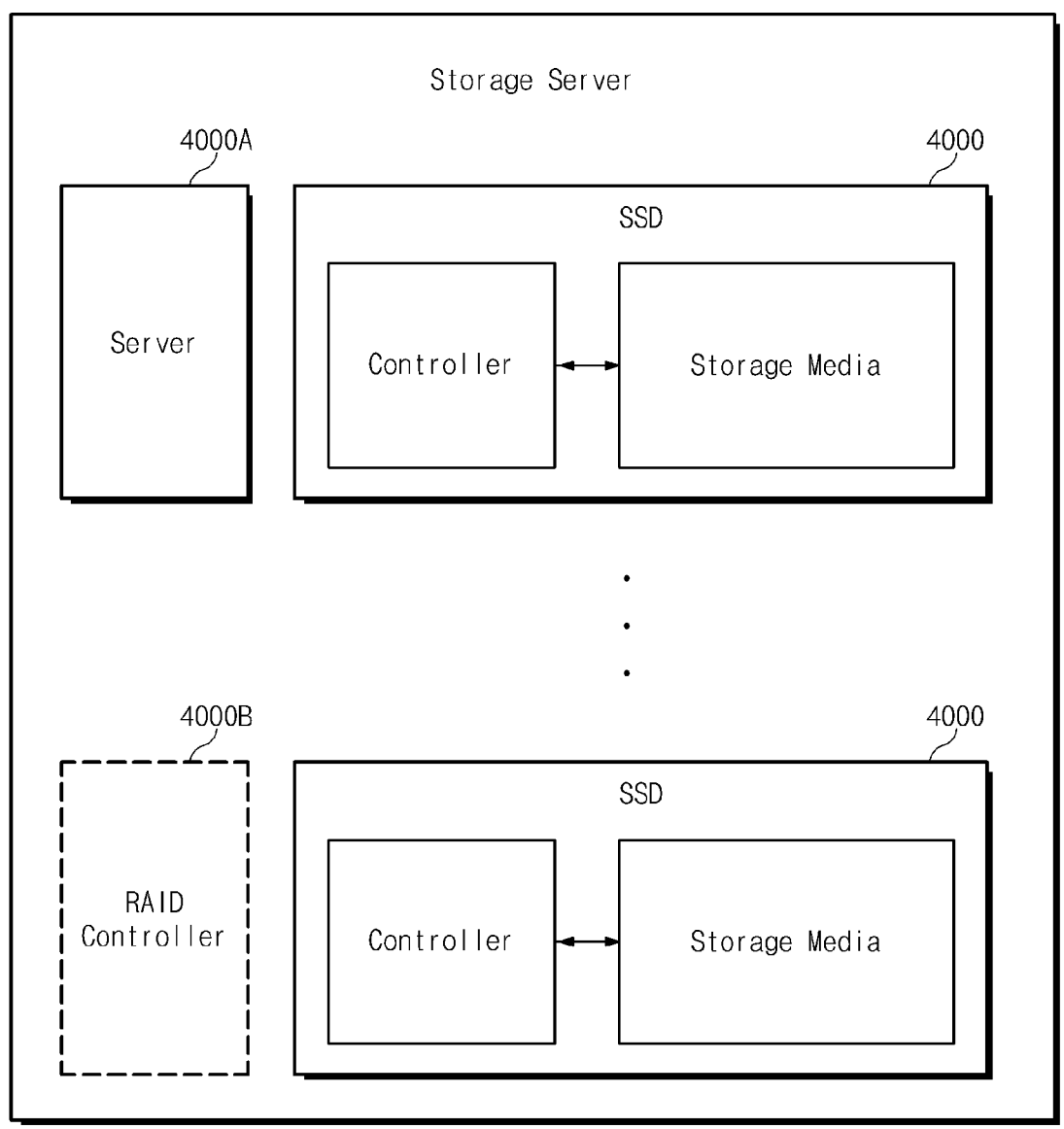
FIG. 27 is a block diagram illustrating a storage server using the solid state drive of FIG. 25

FIG. 26 is a block diagram illustrating a storage using the solid state drive (SSD) 4000 of FIG. 25, and FIG. 27 is a block diagram illustrating a storage server using the solid state drive (SSD) 4000 of FIG. 25.

The SSD 4000 according to an exemplary embodiment of the inventive concept may be used to form the storage. As illustrated in FIG. 26, the storage may include a plurality of solid state drives 4000 which are configured the same as described in FIG. 25. An SSD 4000 according to an exemplary embodiment of the inventive concept may be used to configure a storage sever. As illustrated in FIG. 27, a storage server includes a plurality of solid state drives 4000, which are configured the same as described in FIG. 25, and a server 4000A. Further, it is well comprehended that a well-known RAID controller 4000B is provided in the storage server.

Figure 28:
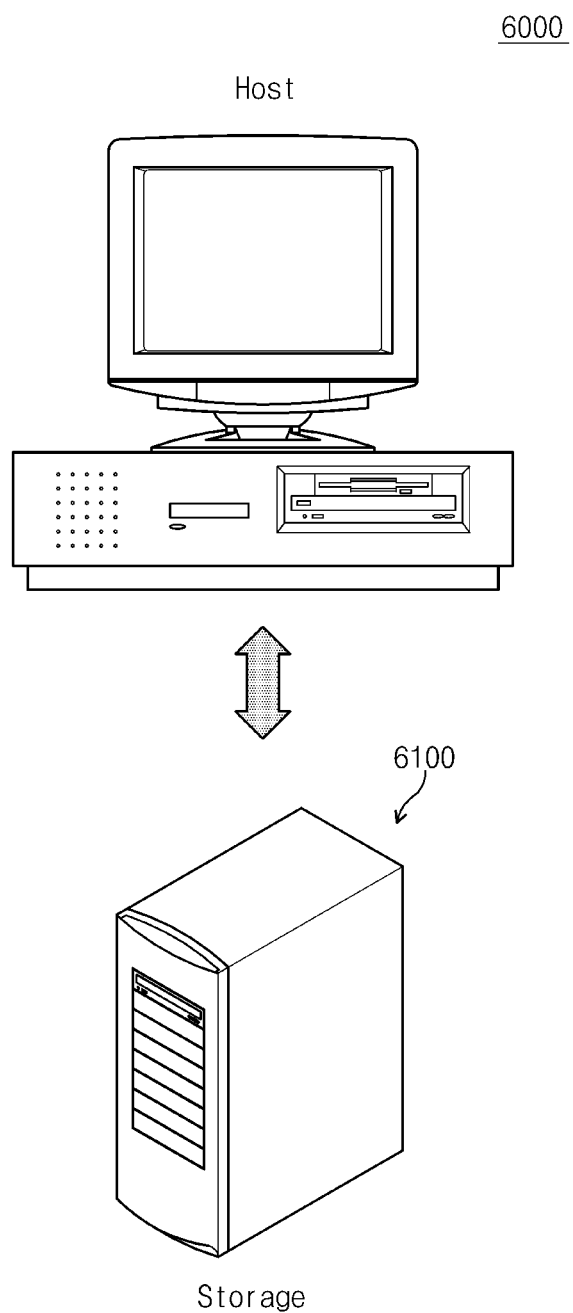
FIGS. 28 to 30 are diagrams illustrating systems having a data storage device according to exemplary embodiments of the inventive concept.
Figure 29:
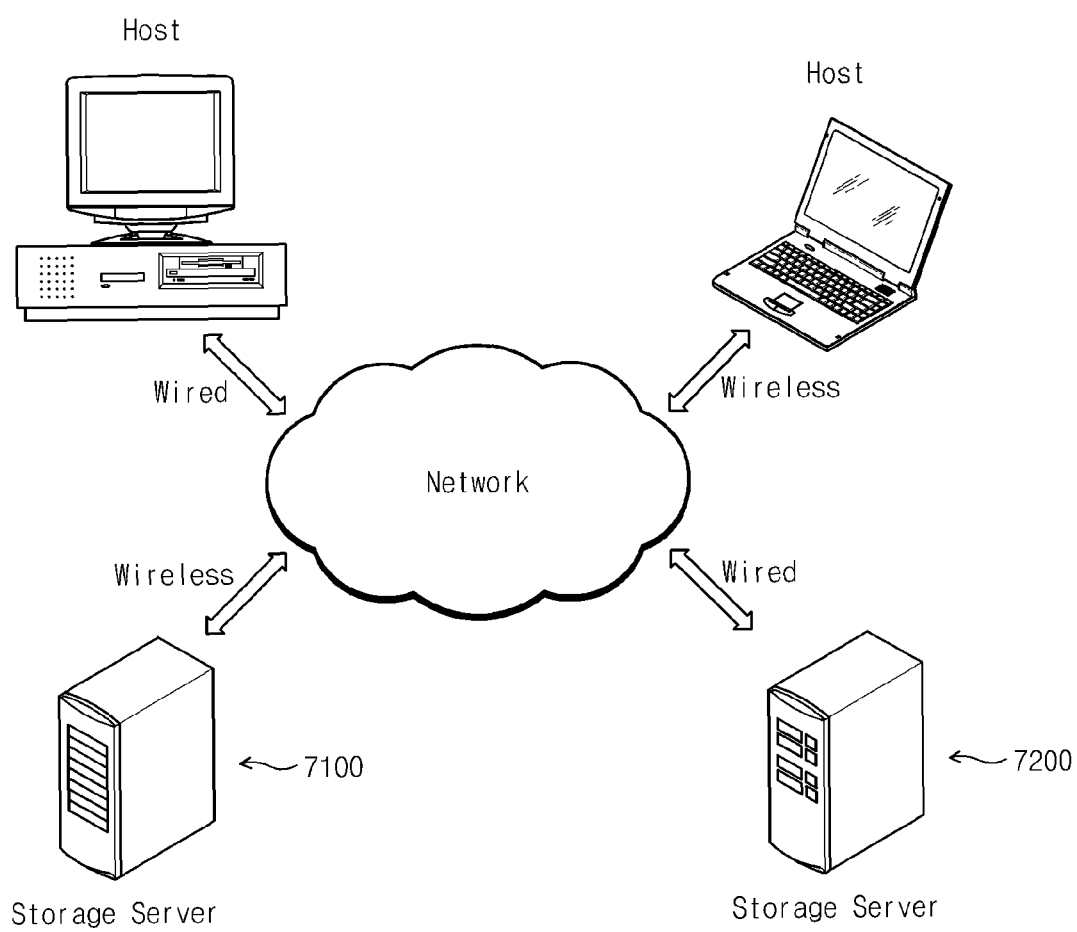
Figure 30:
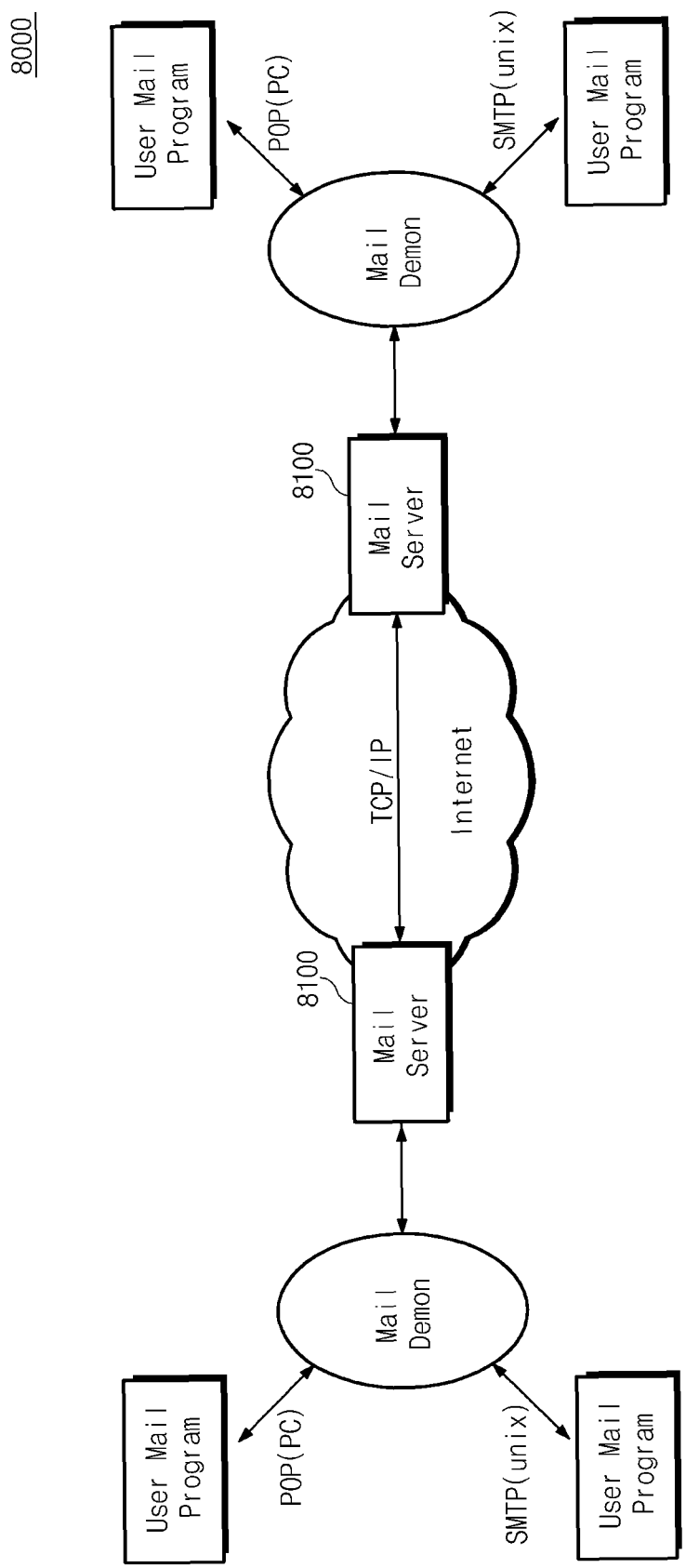

FIGS. 28 to 30 are diagrams illustrating systems having a data storage device according to exemplary embodiments of the inventive concept.

When the system includes a storage, such as a solid state drive including a data storage device formed of a memory controller and a multi-bit memory device according to an exemplary embodiment of the inventive concept, as illustrated in FIG. 28, a system 6000 includes a storage 6100 which communicates with a host by a wire or wireless manner. When a storage server includes a solid state drive including a data storage device according to an exemplary embodiment of the inventive concept, as illustrated in FIG. 29, a system 7000 includes a plurality of storage servers 7100 and 7200 which communicate with a host by a wire or wireless manner. Further, as illustrated in FIG. 30, a solid state drive including a data storage device according to an exemplary embodiment of the inventive concept can be applied to a mail server 8100.

Figure 31:
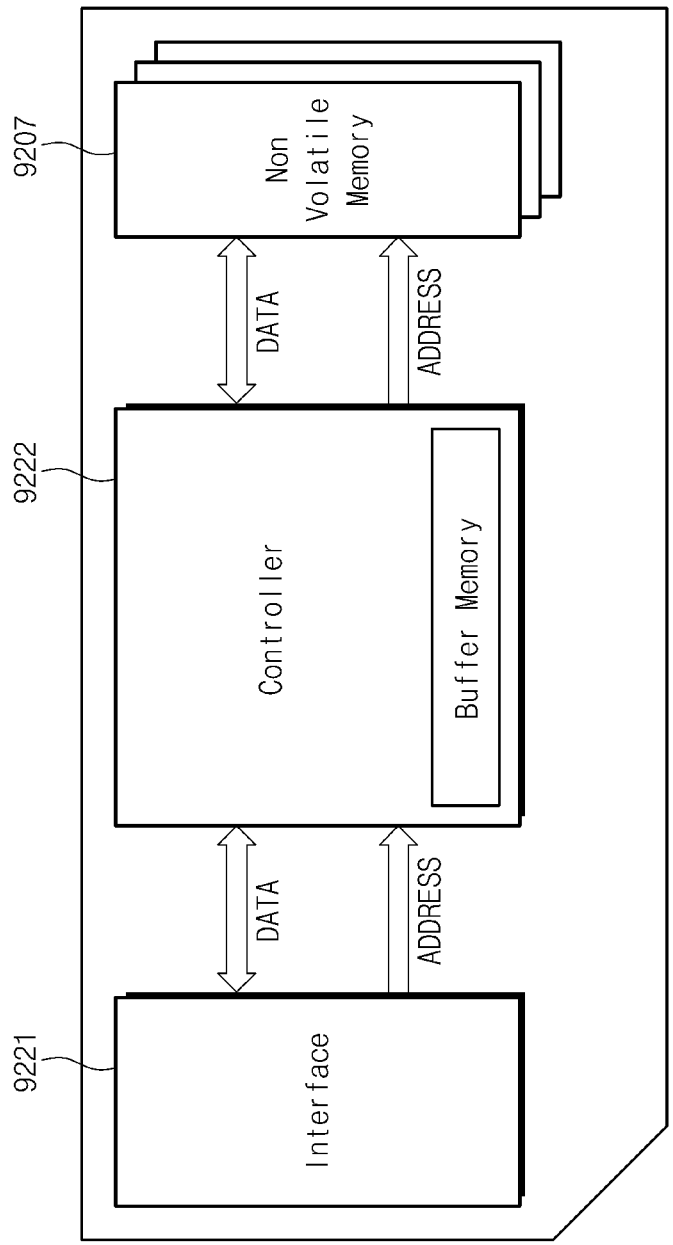
FIG. 31 is a block diagram illustrating a memory card according to an exemplary embodiment of the inventive concept.

FIG. 31 is a block diagram illustrating a memory card according to an embodiment of the inventive concept. The memory card may be an MMC card, an SD card, a multiuse card, a micro-SD card, a memory stick, a compact SD card, an ID card, a PCMCIA card, an SSD card, a chip-card, a smart-card, an USB card, or the like, for example.

Referring to FIG. 31, the memory card may include an interface circuit 9221 to interface with an external device, a controller 9222 including a buffer memory and to control an operation of the memory card, and at least one nonvolatile memory device 9207 according to an exemplary embodiment of the inventive concept. The controller 9222 may be a processor which is configured to control write and read operations of the nonvolatile memory device 9207. In particular, the controller 9222 may be coupled with the nonvolatile memory device 9207 and the interface circuit 9221 via a data bus and an address bus. The controller 9222 and the nonvolatile memory device 9207 may correspond to a controller and a nonvolatile memory device described in relation to FIG. 1 or 14, respectively. The controller 9222 may be configured to control the nonvolatile memory device 9207 according to any one of manners described with reference to FIGS. 1 to 19. That is, since error detection is made by the memory controller and error correction is made within the nonvolatile memory device, it is possible to reduce or prevent a time taken to transfer data to the nonvolatile memory device from the memory controller or a power consumed to transfer data to the nonvolatile memory device from the memory controller.

Figure 32:
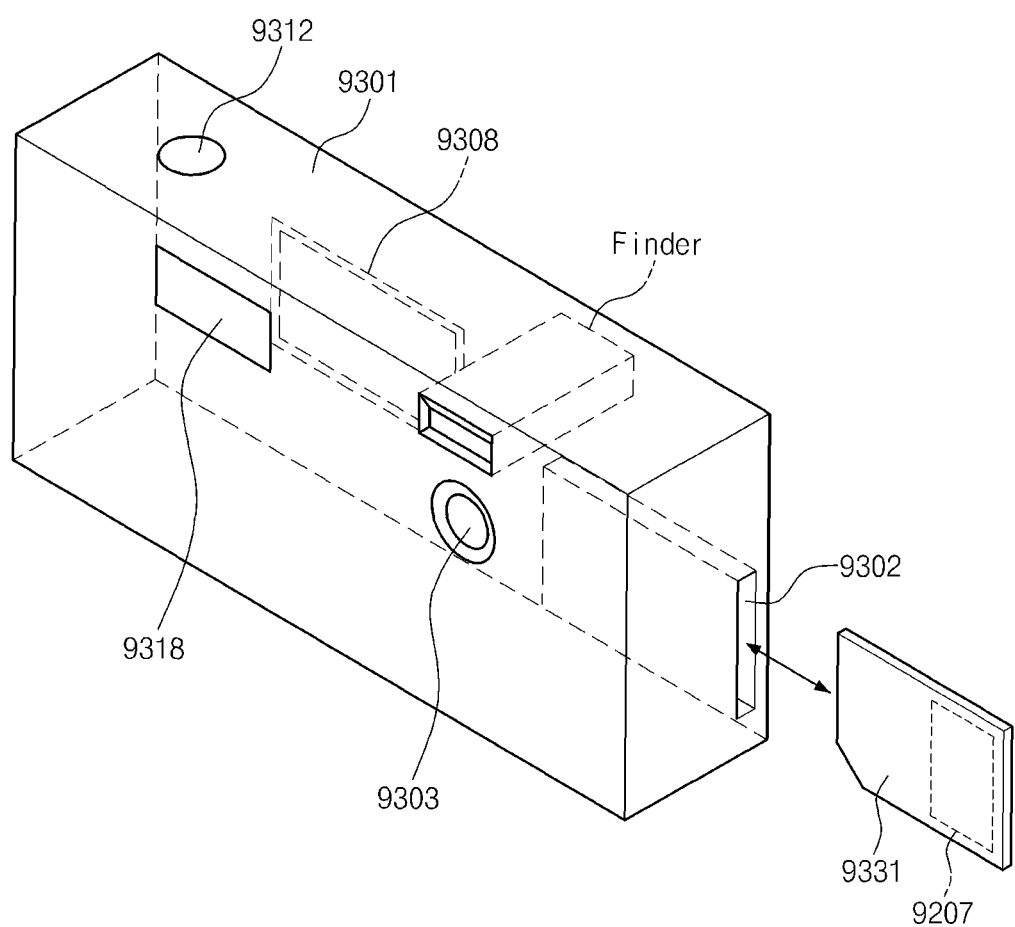
FIG. 32 is a block diagram illustrating a digital still camera according to an exemplary embodiment of the inventive concept.

FIG. 32 is a block diagram illustrating an electronic apparatus, such as a digital still camera, according to an exemplary embodiment of the inventive concept.

Referring to FIG. 32, the digital still camera may include a body 9301, a slot 9302 as a terminal, a lens 9303, a display circuit 9308, a shutter button 9312, a strobe 9318, and the like. In particular, a memory card 9331 may be inserted in the slot 9302 and include a memory controller and a nonvolatile memory device illustrated in relation to FIG. 1 or 14. That is, since error detection is made by the memory controller and error correction is made within the nonvolatile memory device, it is possible to reduce or prevent a time taken to transfer data to the nonvolatile memory device from the memory controller or a power consumed to transfer data to the nonvolatile memory device from the memory controller.

If the memory card 9331 has a contact type, an electric circuit on a circuit board may be electrically contacted with the memory card 9331 when it is inserted in the slot 9302. In the event that the memory card 9331 has a non-contact type, an electric circuit on a circuit board may communicate with the memory card 9331 in a radio-frequency manner.

Figure 33:
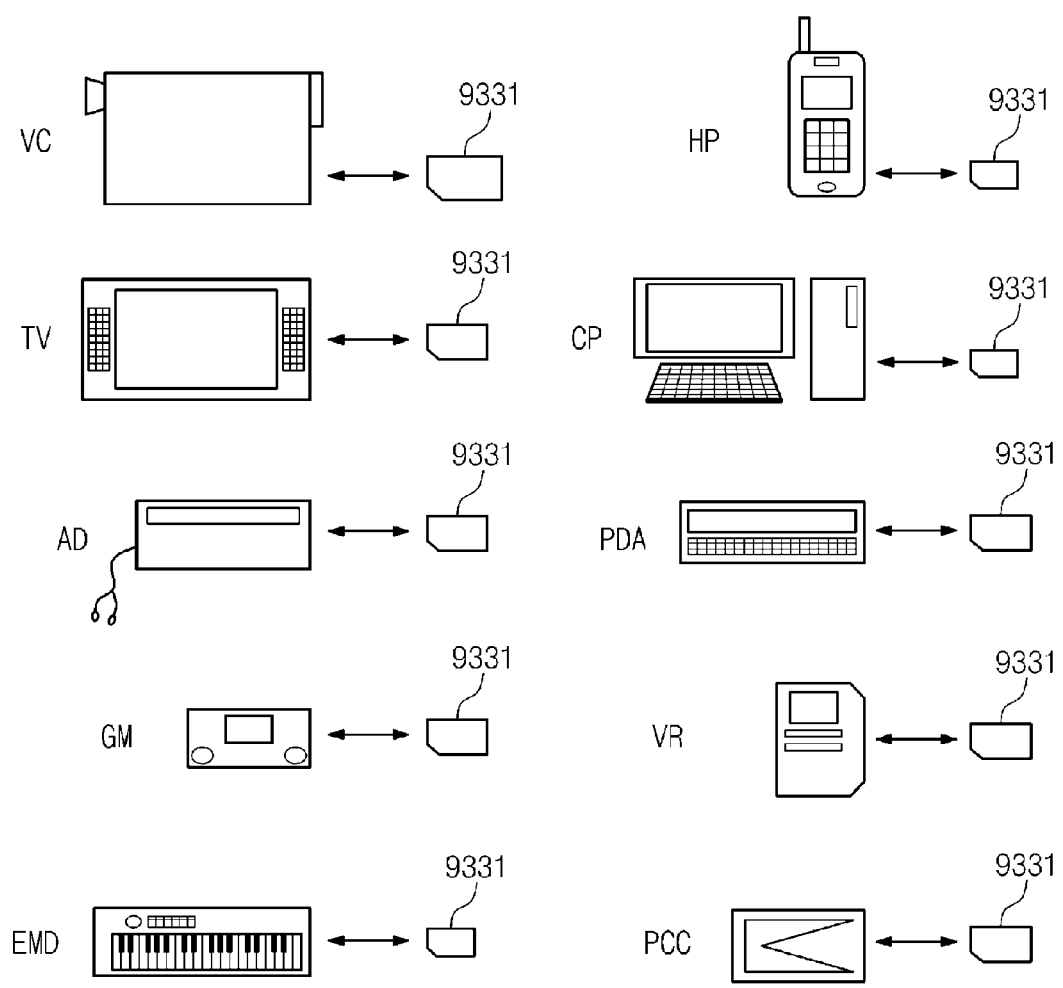
FIG. 33 is a diagram illustrating various systems having the memory card of FIG. 32.

FIG. 33 is a diagram illustrating various systems having the memory card 9331 of FIG. 32 according to an exemplary embodiment of the present general inventive concept.

Referring to FIG. 33, the memory card 9331 may be applied to a host apparatus, for example, a video camera VC, a television TV, an audio device AD, a game machine GM, an electronic music device EMD, a cellular phone HP, a computer CP, a Personal Digital Assistant (PDA), a voice recorder VR, a PC card PCC, and the like.

The host apparatus may include a functional unit to perform an operation of the host apparatus and a terminal formed on a body of the host apparatus to be connectable to the memory card 9331 such that the data generated from the function unit is stored in the memory card 9331 or such that the data of the memory card 9331 is transferred to the functional unit to perform a function thereof using the data. The memory card 9331 may be detachably attached to the terminal. The data stored in the memory card 9331 may perform the above-described operation, for example, the copy operation or refreshing operation during storing the data therein.

The above-illustrated memory system performing the above-described operation may be a contactless smart memory card which can contactlessly or wirelessly communicate with a main apparatus, for example, a host apparatus, to transmit or receive data. The contractless memory card may be supplied with a power from the main apparatus without a cable or contact with the main apparatus.

In an exemplary embodiment of the inventive concept, memory cells can be formed of a variable resistance memory cell. An exemplary variable resistance memory cell and a memory device including the same are disclosed in U.S. Pat. No. 7,529,124, the entirety of which is incorporated by reference herein.

In an exemplary embodiment of the inventive concept, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, etc.

A memory device having a charge trap flash structure as a charge storage layer is disclosed in U.S. Pat. No. 6,858,906 and U.S. Patent Publication Nos. 2004/0169238 and 2006/0180851, the disclosures of which are incorporated by reference herein in their entirety. A source-drain free flash structure is disclosed in KR Patent No. 673020, the entirety of which is incorporated by reference herein.

A non-volatile memory device and/or a memory controller according to the inventive concept may be packed using various types of packages. For example, A non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A memory system, comprising:
a nonvolatile memory device configured to read data, to receive error information, and to correct the read data according to the error information; and
a controller having an interface unit configured to receive the read data, and having a unit configured to determine a location of an error bit of the received read data such that the interface unit outputs the error information on the determined error bit location of the received read data,
wherein the error information includes bits corresponding to bits of the read data, the bits of the error information include a bit representing an error of a bit of the read data, and a value of the bit of the read data is changed according to a value of the bit of the error information.

2. The memory system of claim 1, wherein the nonvolatile memory device outputs the read data to the controller and receives the error information from the controller.

3. The memory system of claim 1, wherein:
the controller outputs the error information to the nonvolatile memory device; and
the error information does not include corrected data of the read data and the read data.

4. The memory system of claim 1, wherein the nonvolatile memory device outputs the read data as randomized data to the controller, and receives the error information as non-randomized data from the controller.

5. The memory system of claim 1, wherein the nonvolatile memory device comprises a page buffer unit to store the read data after outputting the read data to the controller and when receiving the error information from the controller such that the stored read data is corrected according to the received error information.

6. The memory system of claim 1, wherein the error information does not correspond to all of the bits of the read data.

7. The memory system of claim 1, wherein the nonvolatile memory device changes the value of the bit corresponding to the value of the bit of the received error information as a changed bit and stores a maintained bit and the changed bit as corrected data.

8. The memory system of claim 1, wherein the nonvolatile memory device maintains values of bits which do not correspond to the error information and stores corrected data having the bit with the changed value and the bits with maintained values.

9. The memory system of claim 1, wherein the nonvolatile memory device comprises a single bit memory array and a multi bit memory array, reads the data from the single bit memory array, and stores the corrected data in the multi bit memory array.

10. The memory system of claim 1, wherein the nonvolatile memory device reads the data using a single bit program method (SLC) and stores corrected data according to a multi-bit program method (MLC).

11. The memory system of claim 1, wherein the nonvolatile memory device receives the error information in a page unit from the controller.

12. The memory system of claim 1, wherein the read data and the error information have a same data size.

13. The memory system of claim 1, wherein the nonvolatile memory device receives the error information corresponding to the read data in a copying operation to copy the data from a first region to a second region thereof.

14. The memory system of claim 1, wherein the nonvolatile memory device activates the reading of the data and stores corrected data according to the received error information in response to a command indicating a copy operation.

15. The memory system of claim 1, wherein the nonvolatile memory device comprises a page buffer latch configured to perform a correction of the error bit according to the error information in a page unit of the read data, and the page buffer latch is configured to store the read data, the error information, and corrected data.

16. The memory system of claim 15, wherein the nonvolatile memory device performs a bit-by-bit comparison between the bits of the read data and the error information to correct the error bit of the read data according to one of an exclusive OR method and an exclusive NOR method.

17. The memory system of claim 1, wherein the bits of the error information include a second bit representing a non-error of another bit of the read data, and a value of the other bit of the read data is not changed according to a value of the second-bit of the error information.

18. A memory system, comprising:
a nonvolatile memory device to output data; and
a controller having an interface unit configured to receive the data from the nonvolatile memory device, and having a unit configured to determine a location of an error bit of the received data such that the interface unit outputs error location information on the determined error bit location of the received data to the nonvolatile memory device, wherein the nonvolatile memory device corrects the data according to the received error location information.

19. The memory system of claim 18, wherein the controller de-randomizes the received data to determine the location of the error bit from the received data and outputs the information without randomization.

20. The memory system of claim 18, wherein the controller comprises a randomizer/de-randomizer to de-randomize the received data, and the controller prevents the randomizer/de-randomizer to randomize the information.

21. The memory system of claim 18, wherein the nonvolatile memory device comprises a region from which the data has been read and the nonvolatile memory device performs a refresh program on the region according to the corrected data.

22. The memory system of claim 18, wherein:
the nonvolatile memory device comprises a second region to store the corrected data; and
the second region is a multi-bit memory array.

23. The memory system of claim 18, wherein the information on the determined error bit location of the received data comprises an address of the determined error bit location of the received data such that the nonvolatile memory device corrects the data according to the address.

24. A memory system, comprising:
a controller; and
a nonvolatile memory device comprising a first region having a single bit memory array to store data according to a first program method and a second region having a multi-bit memory array, and configured to read the data of each of a plurality of pages from the first region, and configured to output the data of each of the plurality of pages to the controller,
wherein the controller generates error location information of the data of each of the plurality of pages and outputs the error location information of the data of each of the plurality of pages to the nonvolatile memory device,
wherein the nonvolatile memory device corrects the data of each of the pages according to the error location information corresponding to the data of each of the plurality of pages, and stores the corrected data of the plurality of the pages at once in the second region according to a second program method.

25. The memory system of claim 24, wherein the data of the plurality of pages comprises at least a first page and a second page, and the controller repeats receiving the data such that first error information is determined and output in response to the first page and such that second error information is determined and output in response to the second page.

26. The memory system of claim 24, wherein the nonvolatile memory device simultaneously reads the data and receives the error location information.

27. The memory system of claim 24, wherein the nonvolatile memory device comprises a buffer circuit to simultaneously store the read data and the received error location information.

28. The memory system of claim 24, wherein the nonvolatile memory device comprises a main buffer to store the read data and a cache buffer to receive the error location information to correct the stored data in the main buffer according to the error location information.

29. The memory system of claim 24, wherein the nonvolatile memory device comprises a main buffer to communicate with the first region and the second region to store the read data and the corrected data, and a cache buffer to communicate with the controller to receive the error location information.

30. The memory system of claim 24, wherein the nonvolatile memory device performs a flipping operation of flipping a bit of the read data according to the error location information to generate the corrected data.

31. The memory system of claim 24, wherein the multi-bit memory array of the second region comprises a 3-bit memory array.

32. The memory system of claim 24, wherein the second program method comprises a plurality of operations each to generate different voltages according to the corrected data to be stored in the multi-bit memory array of the second region.

33. The memory system of claim 24, wherein the second program method comprises a reprogram method to generate different voltages according to the corrected data to be stored in the multi-bit memory array of the second region.

34. The memory system of claim 24, wherein:
the error location information corresponds to one of portions of the read data;
the read data is repeatedly transmitted from the controller to the nonvolatile memory device;
a number of the error location information are transmitted from the controller to the nonvolatile memory device until corresponding to all portions of the read data; and
the nonvolatile memory device corrects each portion of the read data according to the corresponding error location information upon receiving the corresponding error location information.

35. The memory system of claim 24, further comprising:
a host apparatus having a functional unit and a terminal to be connectable to the controller to the store data in the nonvolatile memory device.

36. The memory system of claim 35, wherein the host apparatus outputs the data generated from the functional unit to be stored in the nonvolatile memory device through the controller or receives the data from the nonvolatile memory device to be used in the functional unit.

37. The memory system of claim 35, wherein the host apparatus comprises at least one of a video camera, a television apparatus, an audio device, a game machine, an electronic music device, a cellular phone, a computer, a personal digital assistant, a voice recorder, a mobile device, and a contactless smart card.

* * * * *